US005771179A

United States Patent [19]

White et al.

[11] Patent Number: 5,771,179
[45] Date of Patent: Jun. 23, 1998

[54] MEASUREMENT ANALYSIS SOFTWARE SYSTEM AND METHOD

[76] Inventors: Leonard R. White; Caroline K. White, both of 178 Foxhunt La., East Amherst, N.Y. 14051

[21] Appl. No.: 518,989

[22] Filed: Aug. 24, 1995

Related U.S. Application Data

[63] Continuation of Ser. No. 220,939, Mar. 31, 1994, Pat. No. 5,446,895, which is a continuation of Ser. No. 808,020, Dec. 13, 1991, abandoned.

[51] Int. Cl.$^6$ .................................................. G06F 15/21
[52] U.S. Cl. ...................... 364/551.01; 375/701; 375/704
[58] Field of Search ....................... 364/551.01; 395/180, 395/701–712, 601, 604, 613, 615, 616, 617, 620, 621; 707/1, 4, 102, 104, 200, 201, 204, 205

[56] References Cited

U.S. PATENT DOCUMENTS

| | | | |
|---|---|---|---|
| 4,631,664 | 12/1986 | Bachman | 364/200 |
| 5,067,107 | 11/1991 | Wade | 395/500 |
| 5,179,698 | 1/1993 | Bachman et al. | 395/600 |
| 5,446,895 | 8/1995 | White et al. | 395/650 |

*Primary Examiner*—James P. Trammell
*Attorney, Agent, or Firm*—Marianne Fuierer; Howard M. Ellis

[57] ABSTRACT

A measurement analysis computer software method and apparatus in which information is stored at the project level wherein a project comprises a collection of work tasks with a time frame and a work product to be delivered, information is stored at the application level wherein an application comprises a cohesive collection of automated procedures and data supporting an objective and one or more components, modules or sub-systems and a direct relationship is provided between information stored at the project level and information stored at the application level. There is also provided integration of measurement, metric and attribute data including data repositories for measurement, metric and attribute data at said project and application levels. The method and apparatus also performs a component explosion process to enable entering multiple components with one entry, provides accurate movement of data between projects and applications to protect the integrity of project and application data, and selectively includes and excludes applications and projects from analysis and reporting.

30 Claims, 38 Drawing Sheets

Figure 4 and all multi page charts to follow are to be assembled according to the above diagram.

MEASUREMENT ANALYSIS SOFTWARE SYSTEM AND METHOD

This is a continuation of application Ser. No. 08/220,939 filed Mar. 31, 1994, U.S. Pat. No. 5,446,895 which is a continuation of application Ser. No. 07/808,020 filed on Dec. 13, 1991 now abandoned.

BACKGROUND OF THE INVENTION

This invention relates to measurement analysis software, and more particularly to a new and improved measurement analysis repository for software development and maintenance processes including new ways to automate a specific measurement analysis method.

Turning first to an overview of the Process Model Analysis Method, the Process Model is a measurement analysis method that is flexible enough to be used for all organizations that employ knowledge workers. Some of the career fields that knowledge workers are employed include the legal profession, engineering, and software development, etc. The present invention automates the process model analysis method for software development personnel.

FIG. 1 shows the process model, as it is automated by the present invention. The process model contains three components of work analysis: input 1.1, process 1.2, and output 1.3. Input and Output are expressed in terms of measures that gauge the effort and cost exerted in the task and the result of that effort. The input and output measures are combined to produce metrics, which are represented by the performance indicators box designated 1.4 in the model. Performance Indicators are productivity ratios that indicate the rate of product delivery, support and quality. A process is a way in which tasks are completed for a project. Process attribute data provides information about the people, work environment, tools, and techniques used to complete the work product.

The Process model of FIG. 1 operates in the following way: The input 1.1 and output 1.2 of the project are measured. The measures are combined to produce metrics 1.4. The metrics are examined and charted to determine how they compare with other project results in the organization. The project metric charts show the statistical groupings of the organization's projects. An analyst can then determine the upper and lower control limits with metric charts such as the upper and lower control limits graph, shown in FIG. 2. A project that is within the control limits 2.1, 2.2 can be considered an average project. Projects that register above the upper 2.1 control limit are considered above average. Projects that fall below the lower control 2.2 limit are below average project.

The analyst is interested in the projects that register outside the control limits. The analyst compares the attributes of the projects to determine if there is a significant difference in team composition, work environment factors, tools used, or techniques used between the above average and below average projects. If there is, the analyst could recommend that attribute to be standardized for all projects in the organization. When used in the way that is outlined hereinabove, the process model of FIG. 1 identifies the ways in which the quality and productivity of processes can be improved internally.

As stated in the description of the process model of FIG. 1, time and cost comprise the input measures and and function points and defects the output measures of a project. There are two input measures, time and cost, and two output measures, failure defects and function points. Each of these four measures now will be described in detail.

Time is work effort represented in hours, days, weeks, months, or years. Time measures are used to record project delivery, repair, enhancement or support durations. Time is calculated with function point and defect measures to determine project delivery, maintenance efficiency, and improvement efficiency metrics. Metrics will be described in detail presently. Cost is the monetary expenditures of the project. Costs are calculated with output measures to determine cost metrics. Defects occur when a product does not meet specifications. While a defective product is not deliverable, the effort that produced the defect still must be taken into account. Once defects are measured they are combined with input and output ratios to produce quality metrics. Function points measure the functionality of software from the user's prospective, regardless of the development or maintenance technology involved. As an output measure, function points are the overall size measure for software applications and projects.

There are five components of functionality. They are: internal logical files; external interface files; external inputs; external outputs; external inquiries. An internal logical file is a user identifiable group of logically related data or control information maintained and utilized within the boundary of the application. An external interface file is a user identifiable group of logically related data or control information utilized by the application that is maintained by another application. An external input process data or control information which enters the application's external boundary, and through a unique logical process maintains an internal logical file and initiates or controls processing. An external output processes data or control information that exits the application's boundary. An external inquiry is a unique input/output combination, where an input causes an immediate output and an internal logical file is not maintained.

A function point counter tallies the number of record types and data element types for the files of the application, and the number of file times referenced and data element types for inputs, outputs, and inquires. A record type is unique record format within an internal logical or external interface file. File types referenced are the number of internal logical files or external interface files read, created, or updated by a component. A data element type is a unique occurrence of data, which is also referred to as a data element variable, or field. Once these are counted, the counter rates the component as low, average, or high according to a defined matrix. A sample of a matrix for external inputs is presented in Table I as follows:

TABLE I

| File Types Referenced | Data Element Types | | |
|---|---|---|---|
| | 1–4 | 5–15 | 16+ |
| 0 or 1 | L | L | A |
| 2 | L | A | H |
| 3+ | A | H | H |

Each component group is then weighted according to the sum of its ratings, as shown in Table II:

TABLE II

| Component | Low | Average | High |
|---|---|---|---|
| External Inputs | 3 | 4 | 6 |

TABLE II-continued

| Component | Low | Average | High |
|---|---|---|---|
| External Outputs | 4 | 5 | 7 |
| External Inquiries | 3 | 4 | 6 |
| Internal Logical Files | 7 | 10 | 15 |
| External Interface Files | 5 | 7 | 10 |

The weighted component totals are then added to produce the unadjusted function point count. The counter then rates the fourteen General System Characteristics, which account for the design characteristics of an application. These characteristics include factors that make the application unique, and ensure that the function point count that reflects the application is precise and not generic. The counter rates each characteristic on a defined scale of 0–5. The characteristics are totalled, multiplied by 0.01 and added to 0.65 to determine the value adjustment factor. The value adjustment factor is multiplied by the unadjusted function point count to determine the final adjusted function point count. The adjusted function point count is the function point measure listed on the output box on the process model, i.e. output 1.3 in FIG. 1.

It was previously noted that the process model works effectively as a measurement analysis method for knowledge workers. Function points are only a measure when analyzing the size for software development and maintenance. For example, if the area being analyzed was a court system, the rules that regulate function point counting can be adapted to work as an appropriate measure reflecting a court's functionality. In particular the components can be changed to case types for a court system, and these case types can be assigned criteria to determine low, average, and high rating. Appropriate general characteristics can be defined to relate to the unique aspects of different courts and then be rated. Similar formulas can than then be used to calculate unadjusted and adjusted "judicial points." This measure can then be considered by work measurement analysts with the other measures in the process model to determine the productivity and quality metrics of the court system.

The role of metrics in the process model now will be considered. Metrics are the result of the combination of the measures listed in the process model. The types of metrics that can be determined from the measures are inventory (i.e. total function points), quality (i.e. number of defects divided by function points), productivity (function points divided by time), and cost (dollars divided by function points). Metrics are the flags for projects performing above average, average, or below average.

Attributes are tracked in the process model and describe the factors that affect the productivity and quality of a project. The attributes comprise the process box of the process model and include teams, work environment, tools, and techniques.

Team information characterizes the composition of application and project teams. Information such as the size of the team and team experience may explain why a project has above average, average, or below average metrics. For example, a team of just the right size that has good job experience and job knowledge would produce above average productivity and quality metrics.

Work Environment information characterizes a team's work surroundings. Ergonomics are an important factor in productivity and quality. For example, poor productivity and quality metrics may result from a project team that is placed in a noisy and cramped environment.

Tools are the utilities used to complete a project. They include both hardware (such as mainframes or personal computers) and software (such as databases and languages) instruments. Poor productivity and quality metrics may be caused by tools that are faulty or out of date.

Techniques are the methods followed while completing a project. For example, a software development and maintenance team may use structured programming for a project. If a team is using an outdated or unnecessary technique, the project's metrics could be below average.

Each of the attribute descriptions hereinabove show, in a very abbreviated manner, how process attributes affect productivity and quality. It is in this part of the process model that improvements are made. The measures and metrics identify and help to classify projects, but the attributes explain how to improve projects. Once an attribute is discovered to be outstanding, it can than be determined if that attribute can be instituted in a project with below average metrics. If the attribute improves the substandard project, steps can be take to standardize that attribute for all projects in the organization.

SUMMARY OF THE INVENTION

The present invention is a software package that includes all elements of the process model. It is the only software package for software development and maintenance management that accomplishes this. It combines a function point calculator, a metric calculator, and an attribute repository. To accomplish the automation of the process model for the software development and maintenance industry, the present invention introduces a number of unique features.

One is the integration of measurement, metric, and attribute data at the project and application levels. As stated previously in this document, the present invention is the only function point analysis software package that incorporates all elements of the process model. What is also unique about this invention is that it captures all process model information at the project and application level. An application is a cohesive collection of automated procedures and data supporting a business objective. An example of an application is a payroll computer program that logs hours, salary rates, tax rules, etc. A project is a collection of work tasks with a time frame that creates new applications or maintains existing ones. Since projects create and maintain applications, an application, such as the payroll program, may have many projects related to it. For this reason it is important for a function point analysis tool to ensure that applications and projects be treated as separate, albeit related, entities. A software development and maintenance manager will want to know the measure, metric, and attribute information for both an application, and all of its separate projects. As described in more detail presently, no other function point analysis software has the capability to track the all the process model information at both the application and project level.

Another unique feature of the present invention is accurate movement of data between application and projects. Since projects create and maintain applications, an application's function point count is the sum of the counts of its related projects. For this reason the present invention introduces five unique methods to move function point information between projects and applications: application update of a baseline or development project; application copy to an enhancement project; application update of an enhancement project; application copy to a baseline or development project; application update backout. The movement of data protects the integrity of the function point counts for applications and projects. It is a feature that is unique to function point analysis software, as will be detailed presently.

Another unique feature of the present invention is component explosion. The data entry of function point counts can be a time consuming task. To ease this process and reduce the number of errors that a data processor may make, the present invention introduces a component explosion feature to function point software. This feature enables the data processor to enter multiple components with one entry as will be described presently.

Another unique feature of the present invention is report flagging for applications or projects that contain faulty data. The present invention helps software development and maintenance managers to identify projects and applications that fall outside of defined upper and lower control limits of FIG. 2. If an application or project contains false data, the results of the control limit graph could be skewed. For this reason, the present invention contains a report flag that allows users to include or exclude projects and applications from reporting as will be described in detail presently. No other function point analysis software package includes this feature.

The foregoing and additional advantages and characterizing features of the present invention will become clearly apparent from a reading of the ensuing detailed description together with the included drawings,

BRIEF DESCRIPTION OF THE DRAWING FIGURES

DETAILED DESCRIPTION OF THE ILLUSTRATED EMBODIMENT

Figure 1:
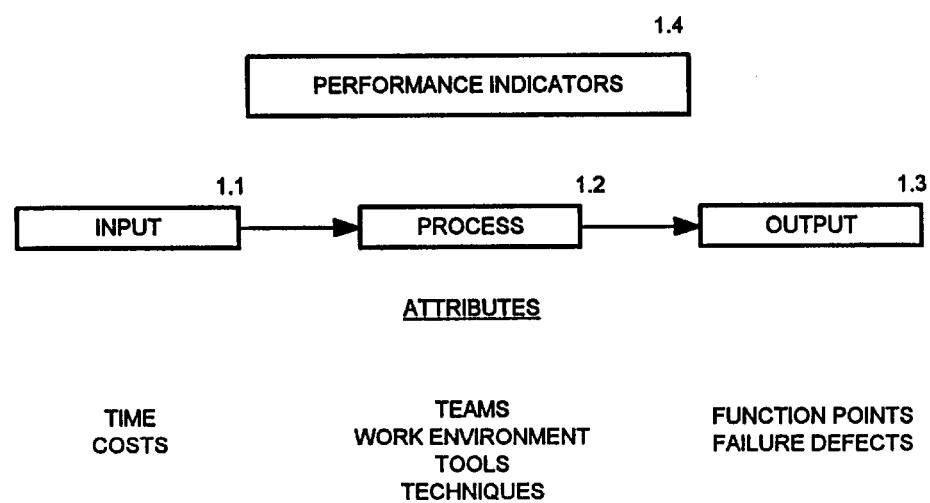
FIG. 1 is a schematic block diagram showing the process model as it is automated by the present invention.

Function Point Analysis, as previously outlined, is performed by creating metrics from measures, selecting key performance indicators, and evaluating attributes' roles in performance change. The methods for performing the analysis range from manual systems, at one extreme, to the present invention, at the other, where data is input and stored at various levels of detail. Current methods for gathering and using the measures will be described for the purpose of facilitating the detailed description of the invention which will follow.

One illustrative current method is manual tracking of process model information, in which input information (time and cost) is obtained from, for example, the labor reporting and cost accounting systems. Process data is recorded on forms categorized by people (teams), environment, tools and techniques. Output represented by Function Point details is recorded on forms, such as the detail worksheet illustrated in Table III as follows.

TABLE III

| Detail Worksheet | | | | | |
|---|---|---|---|---|---|
| Application ID | Application Name | | Prepared by | | MM/DD/YY |
| Notes and Rule Interpretations | | | | | |
| Description | Input | Inquiry | Output | File | Interface |
| Totals | Input | Inquiry | Output | File | Interface |
| Low | | | | | |
| Average | | | | | |
| High | | | | | |

To determine the size of an existing application, the detailed component ratings are summarized and the component weights are applied giving the Unadjusted Function Point count, as illustrated in Table IV.

TABLE IV

| Summary Worksheet | | | | | |
|---|---|---|---|---|---|
| Application Name | | | Prepared by | | MM/DD/YY |
| Project ID | | Project Name | Prepared by | | MM/DD/YY |
| Notes | | | | | |
| UNADJUSTED FUNCTION POINTS | | | | | |
| Type | Component | Low | Average | High | Total |
| EI | External Input | _ X 3 = _ | _ X 4 = _ | _ X 6 = _ | _ |
| EQ | External Inquiry | _ X 3 = _ | _ X 4 = _ | _ X 6 = _ | _ |

TABLE IV-continued

Summary Worksheet

| EO | External Output | _ X 4 = _ | _ X 5 = _ | _ X 7 = _ | _ |
|---|---|---|---|---|---|
| ILF | Internal Logical File | _ X 7 = _ | _ X 10 = _ | _ X 15 = _ | _ |
| EIF | Ext Interface File | _ X 5 = _ | _ X 7 = _ | _ X 10 = _ | _ |
| | | | | Total Unadjusted Function Points | _ |

Function Point Analysis recognizes fourteen general processing characteristics of applications that affect productivity. Each of these General System Characteristics is evaluated on a scale from zero to five. The individual ratings are summed and used to calculate the Value Adjustment Factor, as illustrated in Table V as follows.

TABLE V

GENERAL SYSTEM CHARACTERISTICS

| Characteristic | Rating | Characteristic | Rating |
|---|---|---|---|
| Data Communications | _ | On-line update | _ |
| Distributed Functions | _ | Complex Processing | _ |
| Performance | _ | Reusability | _ |
| Heavily Used Configuration | _ | Installation Ease | _ |
| Transaction Rate | _ | Operational Ease | _ |
| On-line Data Entry | _ | Multiple Sites | _ |
| End User Efficiency | _ | Facilitate Change | _ |
| | | Total Rating | _ |
| Value Adjustment Factor = Total Rating x .01 + .65 | | | _ |

The Value Adjustment Factor is applied to the Total Unadjusted Function points. The result, Total Function Points, represents the size of the application, as follows:

Total Function Points=Unadjusted Function Points×Value Adjustment Factor

Summary information about the other Output in the process model, Failure Defects, is taken from a problem tracking system. Using either paper forms or an electronic spreadsheet, the measurement totals outlined above are recorded and the metrics that are Performance Indicators within an organization are calculated. Data for each performance indicator must be plotted or ranked to detect trends and variations from the norm.

The forms described thus far provide the information to calculate an application size in function points for the first time. Ensuing project effort will be expended to enhance and maintain the installed product. Project size is determined by capturing and evaluating the details of functionality added, changed, or deleted. Using the form set forth in Table VI, detailed ratings are summarized for components added or deleted.

TABLE VI

Component Worksheet - Adds ☐ Deletes ☐

| Application ID | Application Name | Prepared by | | MM/DD/YY |
|---|---|---|---|---|
| Notes and Rule Interpretations | | | | |
| Description | Input | Inquiry | Output | File | Interface |
| Totals | Input | Inquiry | Output | File | Interface |
| Low | | | | | |
| Average | | | | | |
| High | | | | | |

Components changed during the project are identified and summarized. An enhancement project will have a size (work product) of its own as well as cause a size change to the installed application. Keeping track of changed component ratings before the enhancement project began and after project completion provides the information necessary to calculate both project work product and revised application size. This is illustrated in Table VII.

TABLE VII

Component Worksheet - Changes

| Application ID | Application Name | Prepared by | MM/DD/YY |
|---|---|---|---|
| Notes and Rule Interpretations | | | |
| Description | Input | Inquiry | Output | File | Interface |

| | Input | | Inquiry | | Output | | File | | Interface | |
|---|---|---|---|---|---|---|---|---|---|---|
| | Before | After | Before | After | Before | After | Before | After | Before | After |
| Total changes | Before | After | Before | After | Before | After | Before | After | Before | After |
| Law | | | | | | | | | | |
| Average | | | | | | | | | | |
| High | | | | | | | | | | |

The General System Characteristics, previously described, are reviewed and reevaluated if necessary. The calculation of project function points requires both the Value Adjustment Factor of the application before any changes were made and the Value Adjustment Factor resulting from the project's effects on the general functionality of the application. The formula for the revised application size uses only the "revised" Value Adjustment Factor.

The formula for calculating project function points is $$((Adds+Changes-After) \times Value\ Adjustment\ Factor-After)+(Deletions \times Value\ Adjustment\ Factor-Before)=Project\ Function\ Points$$

The formula for revised application function points is $$((Unadjusted\ Function\ Points-Before+Adds+Changes-After)-(Deletes+Changes-Before)) \times Value\ Adjustment\ Factor-After\ *$$

Again, the measurement totals (time, cost, size, and failure defects) are recorded and the metrics that are Performance Indicators within an organization are calculated. Data for each performance indicator is plotted or ranked to observe trends and variations from the norm.

The foregoing discussion of current methods was for the purpose of facilitating the ensuing detailed description of the invention. Turning now to that description, first will be a brief overview of the unique features of the invention. With respect to the feature integration of data, the present invention stores and uses application function point component details as a master list of its function point components and also stores summary information for the calculation of performance indicator metrics. Likewise, project function point component details are captured and the summary information is stored. As to application support time detail, time data is stored to the level of detail defined by the system administrator, and it is also stored in summary format. Similarly, project time is stored to the level of detail defined by the system administrator, and summary time data also is stored. With respect to application support cost detail, cost data is stored to the level of detail defined by the system administrator, and it is also stored in summary format. Likewise, as to project delivery cost detail, project costs are stored to the level of detail defined by the system administrator, and summarized cost data also is stored.

Considering application defects detail, defect data is stored to the level of detail defined by the system administrator, and this includes data about the nature and severity of the problem. Similarly, project defects details are stored to the level of detail defined by the system administrator. With respect to application attributes, the process block of the process model, FIG. 1, encompasses the people that produced output, the physical environment in which they worked, and the tools/techniques they used to perform their tasks. The present invention stores application level information about people, environment, tools/techniques. Similarly, the present invention stores project level information about people, environment, tools/techniques, i.e. project attributes. Using the data stored, the invention can be used to support the Work Product, Quality, and Financial ratios presented by the International Function Point Users Group. Use of process control methods in highlighting metrics that indicate exceptionally good or unusually poor performance that facilitates analysis is found only in the present invention. Thus, integration of data within the invention in conjunction with the detail at which the data is captured, provides more control of the function point data and better analysis capability.

The second unique feature, accurate movement of data, is characterized by copying application detail to project, updating project detail to application and conflict resolution. This provides the mechanism for managing the process model data in the application support and project delivery environment.

The third unique feature, component explosion, may be viewed as explosion of summary function point data and ensures the proper level of detail for capturing function point component information.

The fourth unique feature is report flagging. The present invention provides a facility to exclude data that could produce misleading analysis results. It provides the only function point analysis software that has the process to exclude applications and exclude projects from reports.

The present invention is more than an electronic replacement for the manual tracking of process model information. The functionality provided advances the prior art in that all process model information is made available for analysis. In addition, all the process data necessary for further investigation is available in the repository. The present invention also introduces a mechanism for ensuring the integrity of the component data through the previously mentioned method of component explosion. This technique, along with the previously mentioned conflict resolution routines built into the update process, ensures the granularity and accuracy necessary for proper management of detailed function point data. There are times when adjustment projects are created to correct an erroneous application size. Similarly, sample application and project records are generated to be used as patterns for data capture and modeling. In order to prevent these from distorting the metric analysis reports, the present invention uses an analysis flag to give the administrator the ability to exclude those applications or projects.

Having presented an overview of the unique features of the invention, the description now will concern the hierarchical structure of the data for analysis with particular attention paid to the relationship of and differences between application and project data. A case study outlining a business use of the present invention is also presented.

Figure 3:
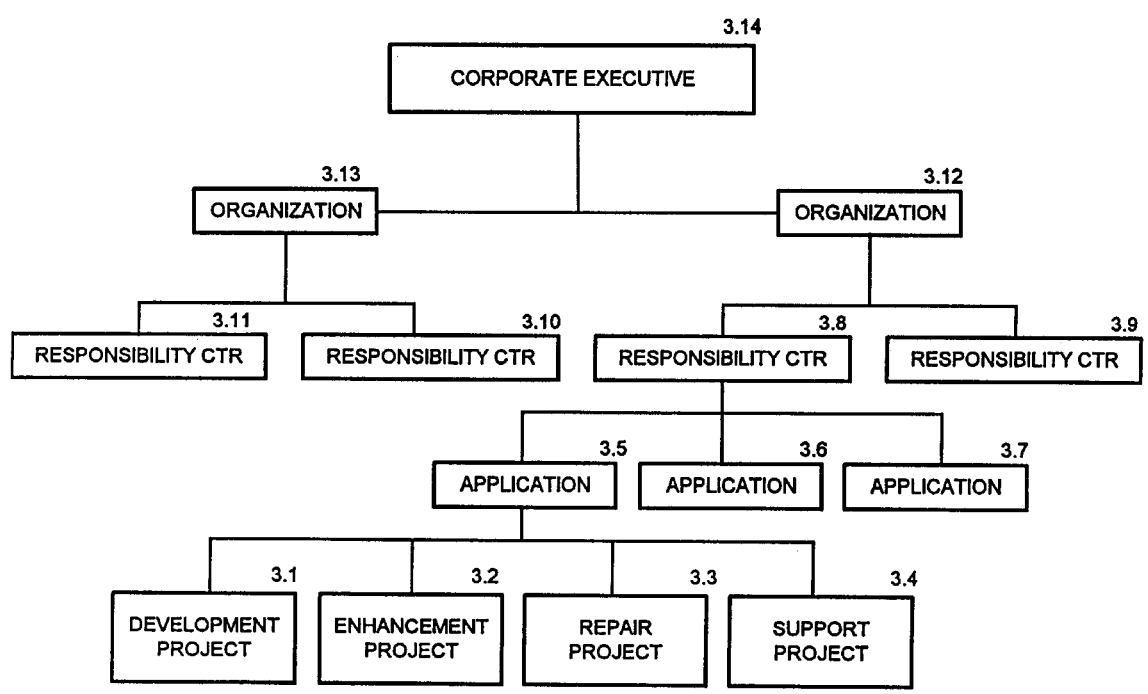
FIG. 3 is a schematic block diagram illustrating data organization relationships within the present invention.
Figure 4A:
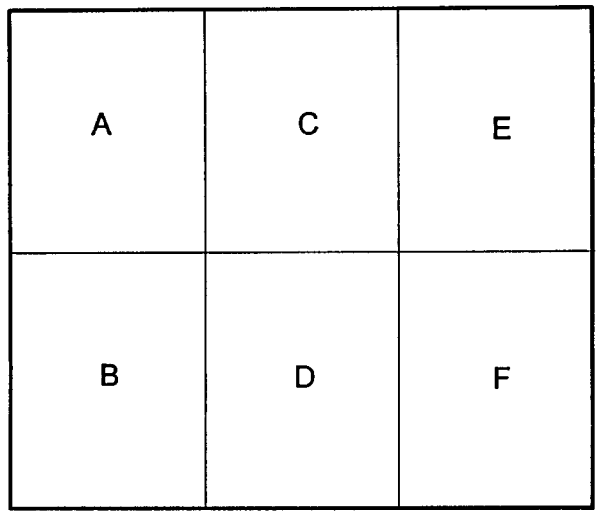
FIG. 4 is a flow chart representing a sample information system showing use of the present invention to establish a new development project.
Figure 4A:
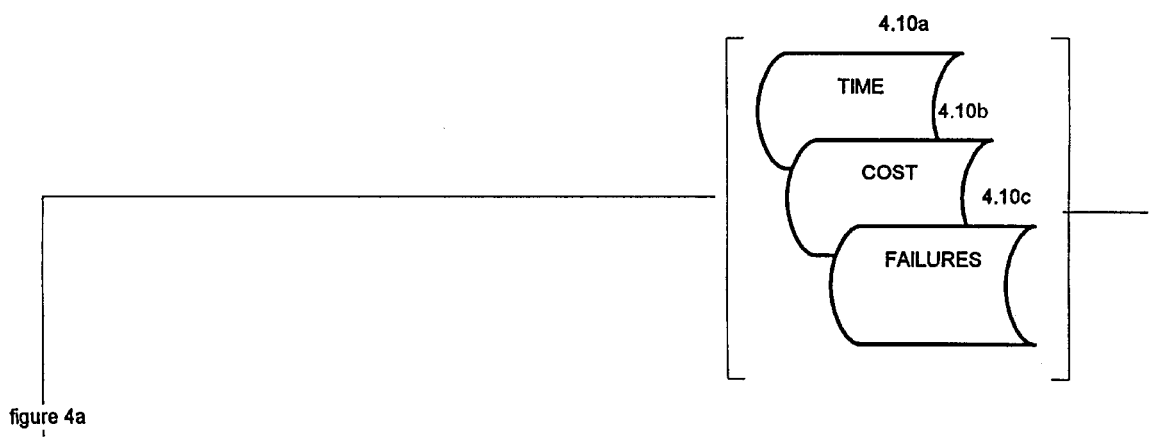
Figure 4B:
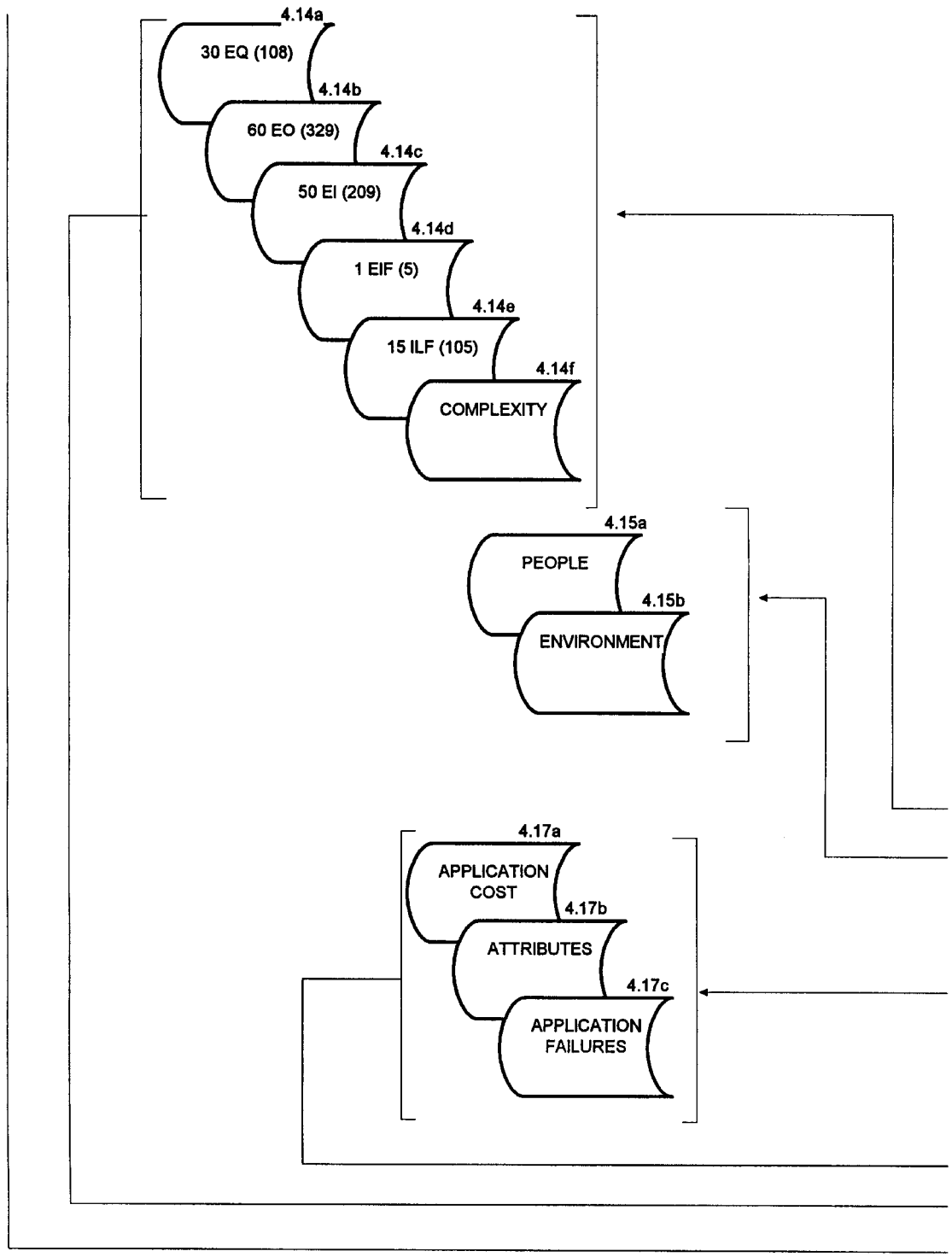
Figure 4C:
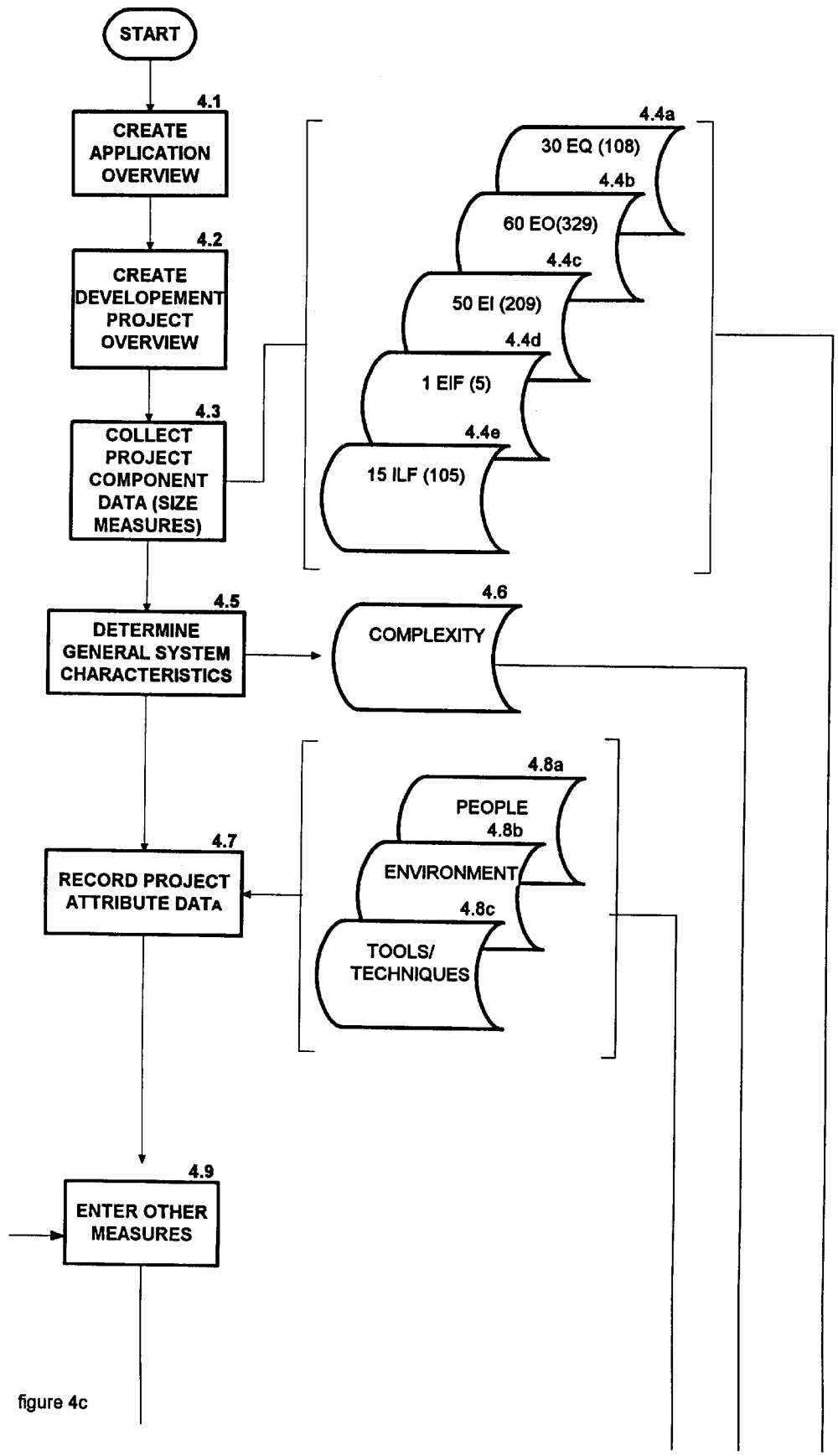
Figure 4D:
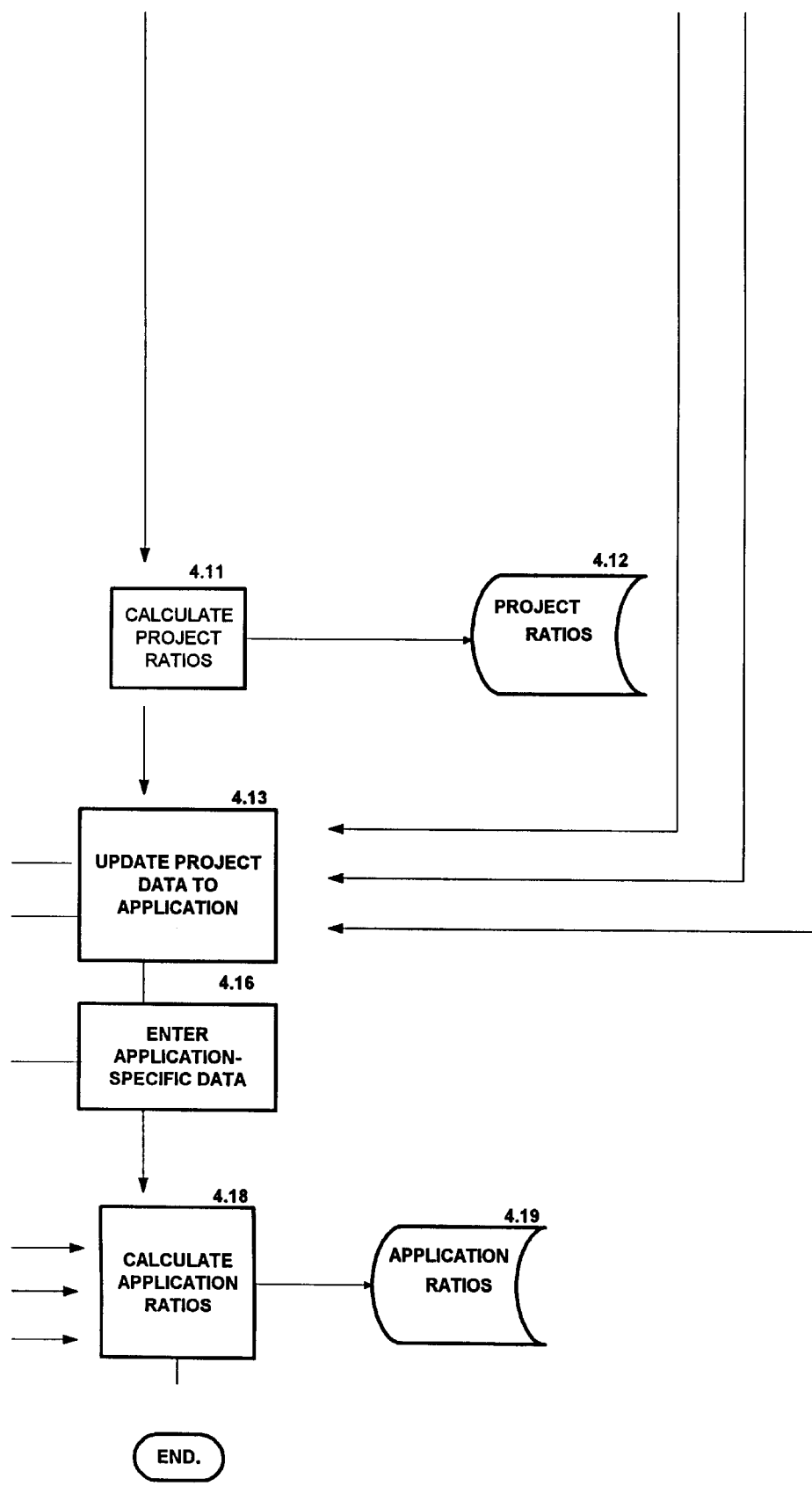
Figure 5A:
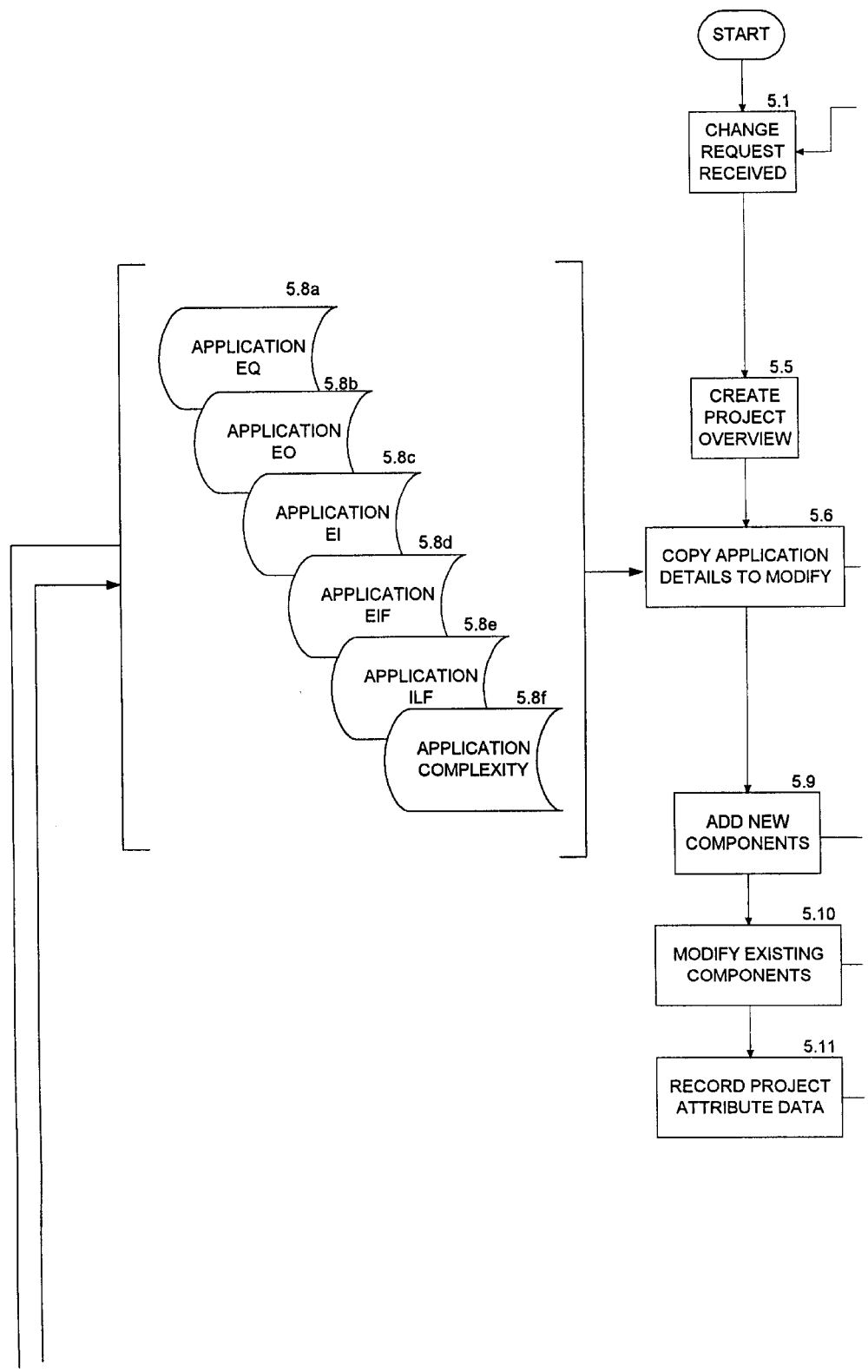
FIG. 5 is a flow chart representing a sample information system showing use of the present invention to establish an enhancement project.
Figure 5B:
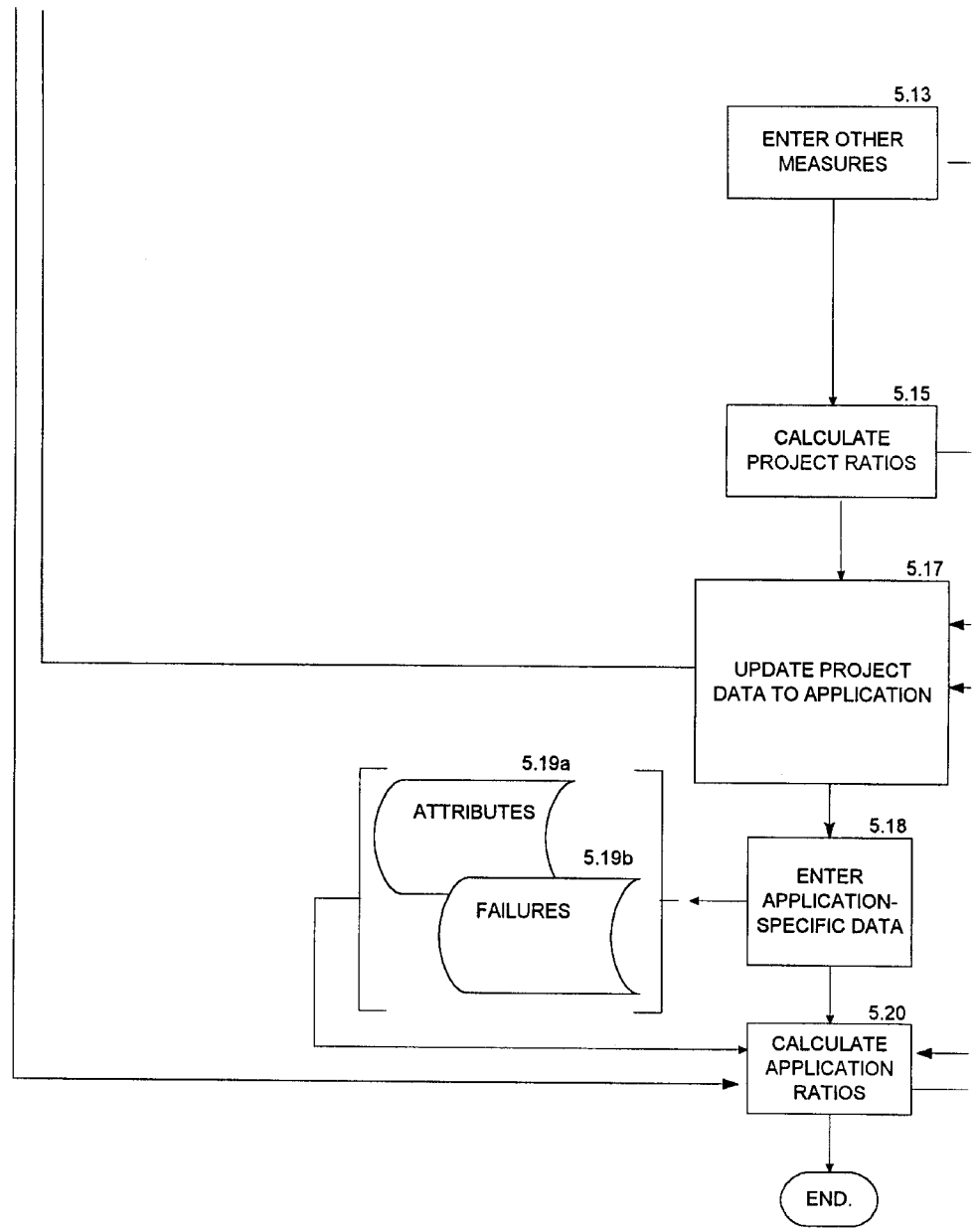
Figure 5C:
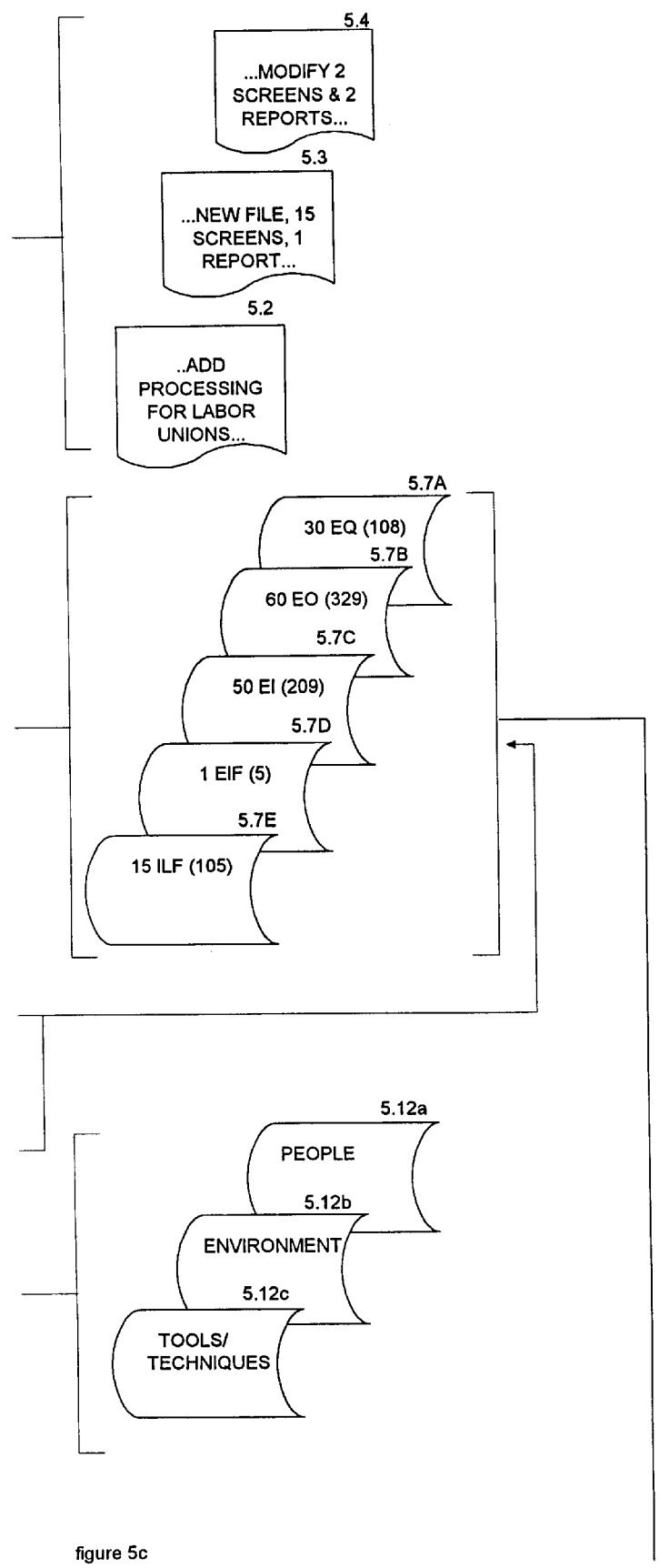
Figure 5D:
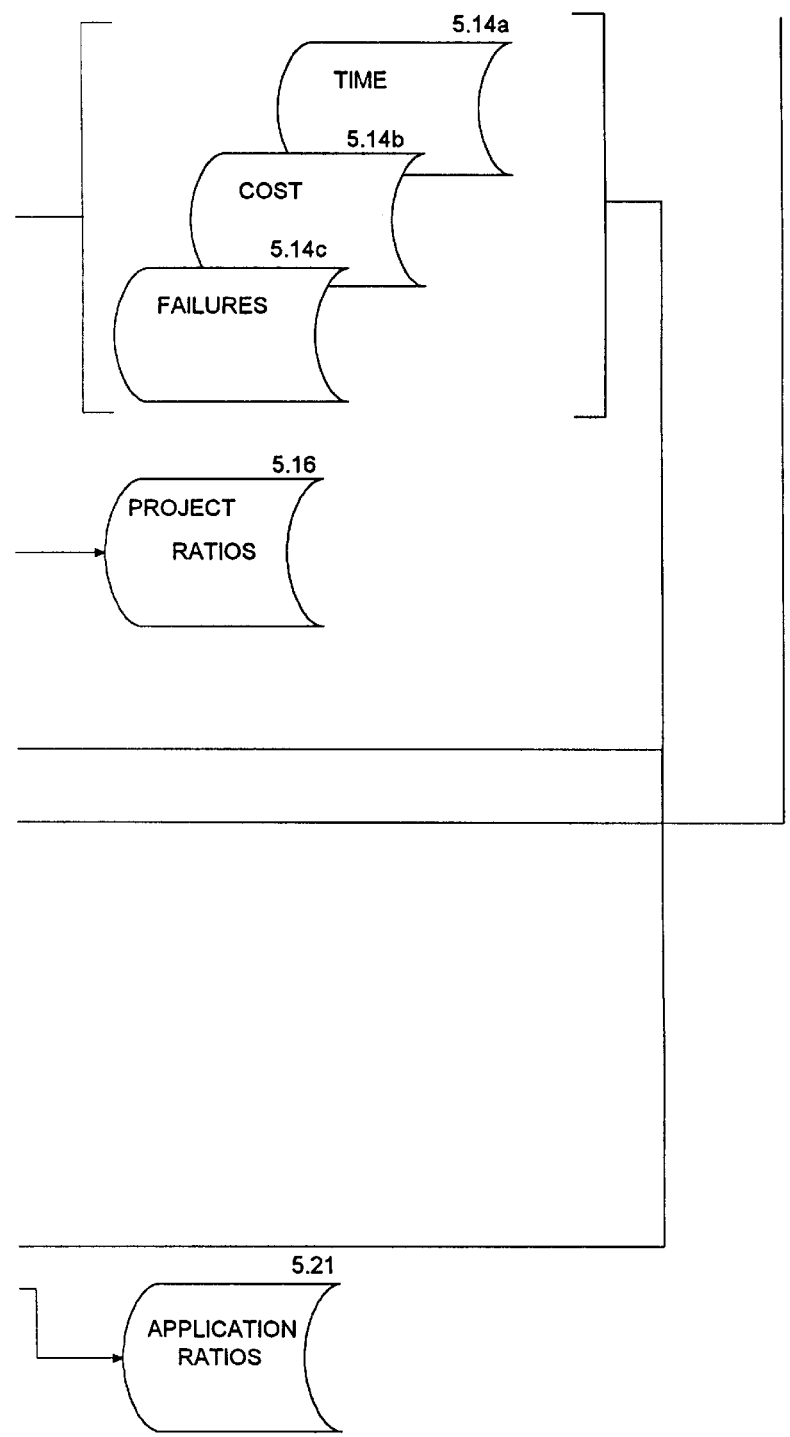

FIG. 3 illustrates data organization relationships within the present invention. Data can be entered at the project or application levels. Each Project 3.1, 3.2, 3.3, 3.4 is attached to an application 3.5, 3.6, 3.7. Application records are linked to a Responsibility Center 3.8, 3.9, 3.10, 3.11. Responsibility Centers report to Organizations 3.12, 3.13. Organization level data rolls up into the Corporate Executive 14 structure. All performance indicator metrics, performance indicators and metrics having been described previously, calculated at the project and/or application levels are reported with average values, weighted average values, upper control limits, and lower control limits at all superior levels (control limits having been described).

The difference between application and project data is important to an understanding of the invention. Application data is the information about a software solution to a business need. A payroll application, for example, provides the processes necessary to maintain employee salary information, generate pay checks, retain historical information and produce pay registers and documents for internal and external reporting. The following are the process model elements and the type and use of data that is stored for the application:

Input

Time represents the hours spent to keep the application performing to specification without changing its functionality. Data is used in calculation of Support Rate.

Cost is the money spent to keep the application performing to specification. It is used to calculate maintenance cost metrics.

Process

Team data provides information about the personnel performing support tasks. Data is used in analysis to show the effects of factors such as experience and training.

Environment data provides information about the physical surroundings of the personnel performing support tasks. Data is used in analysis to show the effects of factors such as climate, space, availability of quiet time.

Tools data provides information about the hardware and software used to perform support tasks. Data is used in analysis to show effects of factors such as programming languages, computer equipment, operating systems.

Techniques data provides information about the methods used by support personnel. The data is used in analysis to show effects of factors such as documentation, walk through, regression testing.

Output

Size as measured in function points is the functionality provided by the installed software. The data is used in calculation of all application level performance indicators.

Failure defects represent the instances where the installed software does not perform according to specification. The data is used in calculation of performance indicators used to monitor quality.

Project data is the information about the work to define, refine or repair the application. As illustrated in FIG. 3, there are multiple projects types. A development project is used to create the new application (initial payroll system). Enhancement projects change the functionality of an existing application, usually causing a change in the size of the application (introducing files, screens and reports to accommodate labor union requirements). Repair projects fix the application where it fails to meet user specifications or expectations (net pay is being incorrectly calculated). Support projects keep the application in good business health (calculations are changed to accommodate changes in tax laws). The following are the process model elements and the type and use of data that is stored for the project:

Input

Time represents the hours spent to complete the project tasks. Data is used in calculation of Delivery rate for Development and Enhancement Projects. Repair and Support project time rolls up into the application Support Rate.

Cost is the money spent to perform project tasks. It is used to calculate development and maintenance cost metrics.

Process

Team data provides information about the personnel performing project tasks. Data is used in analysis to show the effects of factors such as experience and timing.

Environment data provides information about the physical surroundings of the personnel performing project tasks. Data is used in analysis to show the effects of factors such as climate, space, availability of quiet time.

Tools data provides information about the hardware and software used to perform project tasks. Data is used in analysis to show effects of factors such as programming languages, computer equipment, operating systems.

Techniques data provides information about the methods used by project teams. The data is used in analysis to show effects of factors such as Joint Application Development, walk through, regression and stress testing.

Output

Size represents the total functionality affected in the installed software (added, modified, or deleted). The data is used in calculation of all project performance indicators.

Failure defects represent the instances where the project deliverables do not perform according to specification. The data is used in calculation of project performance indicators used to monitor quality.

A business use of the preset invention will be shown through the following case study. The flow charts in pages FIGS. 4, 5 and 6 demonstrate processes for capturing and integrating application and project data according to the present invention. The case study uses a payroll system. The initial development provided the functionality for maintaining basic employee information, generating weekly payroll checks and registers (time, pay, and deductions), and retaining historical information for monthly, quarterly and annual reporting. After the payroll system had been in production for two years, an enhancement was requested by the personnel department. When the payroll system was first installed, there was only one labor union in the corporation. Since then, multiple bargaining units have come into play and the deductions mechanism could not support the information necessary for effective administration of the related payroll functions. An enhancement project was initiated to provide the additional functionality to meet the new business needs.

The flow chart of FIG. 4 represents a sample Information System showing the use of the present invention to establish a new development project, i.e. to capture data about the development of a payroll application. A the end of the flow, the present invention will have process model information stored about the development and the application. Analysis data will also be available in the organization of FIG. 3 at the Responsibility Center 3.8–3.11, Organization 3.12, 3.13 and Corporate Executive 3.14 Level.

Arrows in FIG. 4 point to the next action to be taken after the current step is complete, rectangles indicate the action taken based on data or previous decision, and rectangles with concave sides indicate data stores.

The user enters the application overview information in operation 4.1 to create and validate the payroll application ID. All process model information about the payroll application will be related to this ID. The user then enters the project overview information to create and validate the payroll application's development project, as indicated in block 4.2. Component information is then collected in operation 4.3. The illustrative development project has 30 external inquiries, 60 external outputs, 50 external inputs, 1 external interface file, and 15 internal logical files 4.4a–e. The project's general system characteristics are also included in the measurement calculations 4.5, and the specific characteristic, complexity, is determined in operation 4.6.

Once the size information is collected, the user enters the project's process attributes at 4.7. These attributes include team information, work environment information, data about the tools and techniques used for the project 4.8a, 4.8b, and 4.8c, respectively. The user adds information about time, cost, and defect incidents at the project level as indicated at 4.9–4.10c. This information is used with the size (function point) data to calculate the project performance indicators 4.11 and 4.12. i.e. project ratios.

The development project data is complete and is ready for the user to generate the payroll application installed base data. The user initiates the update process, which moves project component, team, and environment information to the application level as indicated by operation 4.13 and data stores 4.14a–f and 4.15a, 4.15b. Application attribute information regarding documentation, support tools, or customer satisfaction can now be added to the payroll application by the user, as indicated by operation 4.16 and data store 4.17. The user adds application cost 4.17a and defect incident 4.17c information. This information is used with component size information to calculate the application performance indicators 4.18 and 4.19.

The flow chart of FIG. 5 illustrates a sample Information Systems showing the use of the present invention to establish an enhancement project, i.e. to capture data about enhancement of a payroll application. At the end of the flow, the present invention will have process model information stored about the enhancement project and its effect on the payroll application base. Analysis data will also be available for the organization of FIG. 3 at the Responsibility Center 3.8–3.11, Organization 3.12, 3.13 and Corporate Executive 3.14 Levels.

Arrows in FIG. 5 point to the next action to be taken after the current step is complete, rectangles indicate the action taken based on data or previous decision, rectangles with concave sides indicate data stores. The rectangles with curved lower sides indicate requirements documents.

The user receives a request to change the functionality of the payroll application as indicated in block 5.1. In order to provide the additional data needed, it is necessary to modify 15 screens, 3 reports, 1 file, and add files, screens and reports to support the expanded labor union reporting requirements, as illustrated by the requirements documents designated 5.2, 5.3, and 5.4. The user creates an enhancement project overview attached to the payroll application in operation 5.5 which validates the project and is used to gather its process model information. The user then copies the existing application size data to the enhancement project as indicated in block 5.6. This includes external inputs, external inquiries, external outputs, external interface files, internal logical files and general system characteristics from data stores 5.8a–5.8f which are copied into data stores 5.7a–5.7f.

Next, the user adds the new component details to the enhancement project and modifies components copied form the application level during the previous step in operations 5.9 and 5.10 respectively. The user enters project attributes in operation 5.11, which include team, environment, tool, and technique data contained in data stores 5.12a–5.12c. The user then enters other project measurement information in operation 5.13, such as time, cost, and defect failures contained in data stores 5.14a–5.14c. The data is used with size data to calculate the enhancement project's performance indicators, as indicated in data stores 5.15 and 5.16. The enhancement project is ready to be updated to the payroll application. Thus, the changes made to the project contained in data stores 5.7a–5.7f and 5.14a–5.14c will be reflected at the application level. The update by operation 5.17 revises the application process model data contained in data stores 5.8a–5.8f. The user now enters other application specific data during operation 5.18, including costs, attributes, and defect failures, which are placed in data stores 5.19a, 5.19b. This information is used with size information to calculate the application's performance indicators in operations 5.20 and 5.21.

Figure 6:
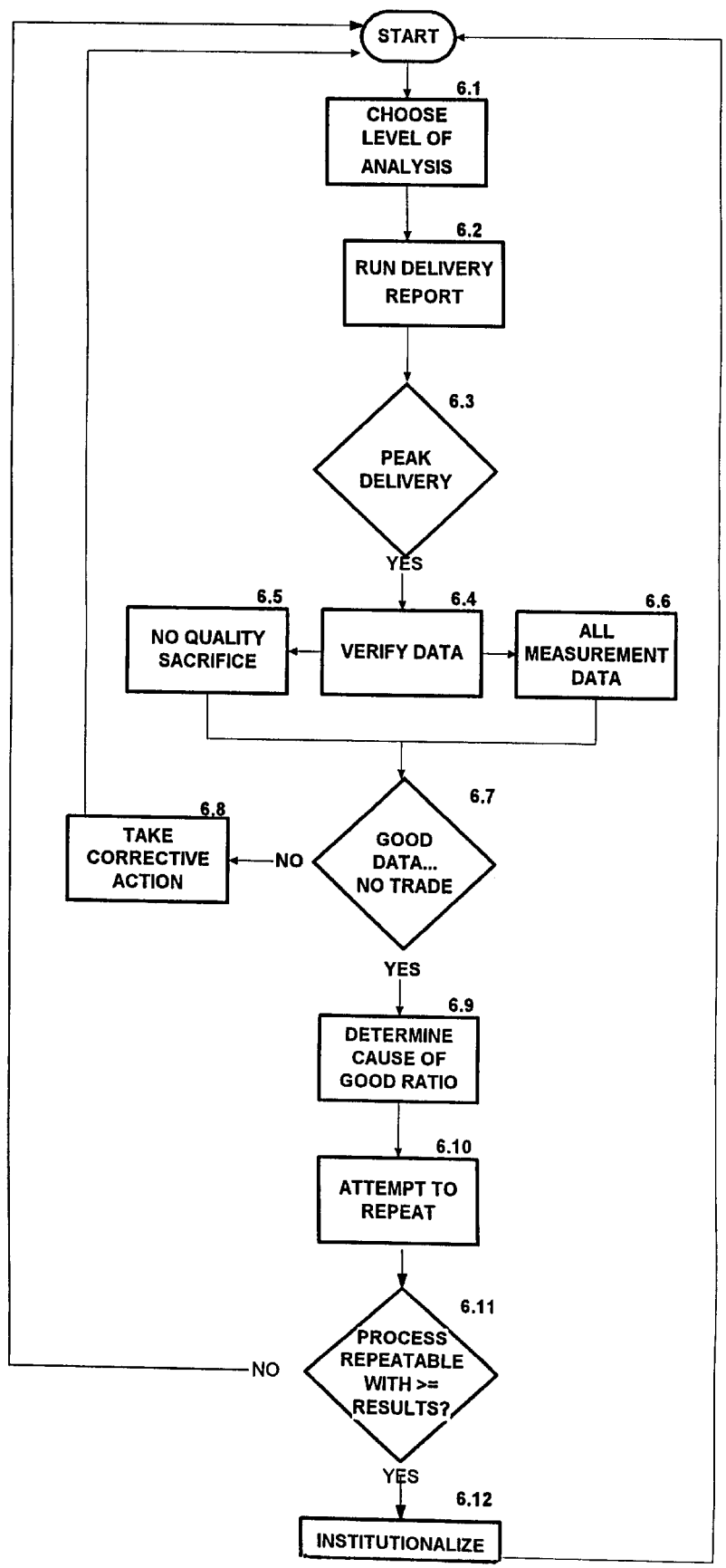
FIG. 6 is a flow chart of the method for analysis that the present invention facilitates.

FIG. 6 is a flow chart of the method used for analysis that the present invention facilitates, according to the sample business application. Arrows in FIG. 6 point to the next action to be taken after the current step is complete, rectangles indicate the action taken based on data or previous decision, and diamonds illustrate decisions.

The first step in analyzing an application is to choose the level of analysis, as indicated by operation 6.1. The invention has five levels of reporting: corporate executive, organization, responsibility center, application, and project, as previously described in connection with FIG. 3. There are several types of reports that can be run concerning support, quality, and time. For the purpose of this example, a delivery report is analyzed, as indicated in block 6.2. The invention reports the delivery times for the projects that update the application. The invention helps the user identify the project or projects with the best delivery rates, by means of decision 6.3.

Once the project that has the best delivery rate for the application has been identified, the user must verify that the measurement data is correct and ensure that the steps taken to produce the delivery rate did not compromise the quality of the project. This is illustrated by operations designated 6.4, 6.5 and 6.6. The user can accomplish this by examining the project's component and incident records. If the user discovers that the data is corrupt or that the quality of the project has been compromised, as indicated by decision block 6.7, corrective action must be taken and the project is reevaluated in operation 6.8. On the other hand, if the project data proves to be true, and the quality of the project is preserved, the user identifies the cause of the good delivery rate by examining the project's team, environment, and tool and technique records in operation 6.9.

The user then determines if the factors that resulted in the good delivery rate are repeatable. This is illustrated by operation 6.10 and decision 6.11. If they can be repeated, they are institutionalized for other projects and applications of the organization, as indicated in block 6.12.

To summarized briefly, the process model analysis method was outlined, the present invention was introduced as a software package that automates of elements of the model. Next, current manual and automated technology that exists to perform the measurement analysis was described in detail. After that the shortcomings of the current measurement software packages in automating the process model were pointed out. Finally the overall design of the present invention was described in detail.

The present invention is the most complete measurement analysis software currently available, in terms of the process model. To accomplish this, the present invention introduces several unique features to the measurement software environment, and those features now will be described in detail.

Figure 7:
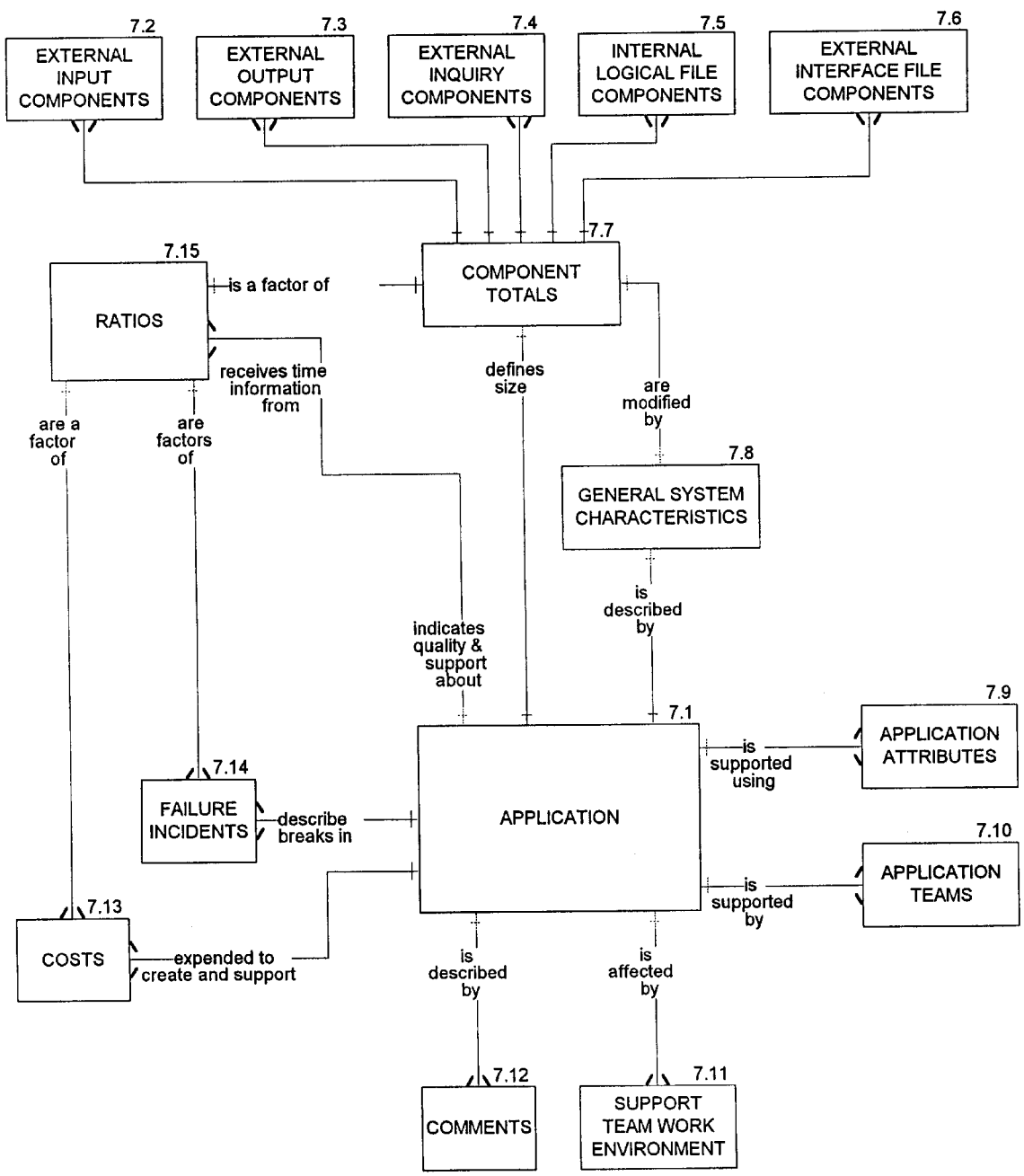
FIG. 7 is an entity relationship diagram showing the integrated application data sets according to the present invention for the application level.

A first unique feature is integration of measurement, metric, and attribute data at both the application and project levels. Turning first to the application level, FIG. 7 is an entity relationship diagram showing the integrated application data sets according to the present invention. Each rectangle on FIG. 7 represents a logical collection of data. The connecting lines indicate a relationship. The marks at the extremes of the connecting line show the nature of the relationship, i.e. a single intersecting line at both ends denotes a one-to-one relationship between records, a "crow's foot" at both ends represents a many-to-many relationship, a single intersecting line at one end and a "crow's foot" at the other end shows that a one-to-many relationship exists.

The present invention automates all elements of the process model previously described herein. As explained earlier, the present invention distinguishes application information from project information to ensure the integrity of data. A first unique feature that the present invention introduces is the automation of the elements contained in the process model at the application level. The measurement information that is stored for the application includes function points, cost, failure defects.

As previously described herein, an application's function point information is entered through its related projects. For this reason, function point information is not entered directly input into the application itself, rather its count is updated by related projects. The process that updates project information to related application is considered another unique aspect of the invention and is treated as such herein. Once the information is updated to the application 7.1, it is stored according to component type, i.e. external inputs, external outputs, external inquiries, internal logical files, and external logical files designated 7.2–7.6 respectively. The fourteen functional characteristics 7.8 are also included in the information that the project updates to the application. The sum of the application's related project function point counts are totaled to produce the application's unadjusted function point count, which is stored in component totals data set 7.7. The application's unadjusted function point count is then multiplied by the function characteristics and produces the application's adjusted function point count, which is the size of the application.

Application costs are entered at the application level 7.13, as is the log of failure defects. Time, the fourth measure of the process models, is automatically tracked by the present invention. Application Ratios 7.15 tracks the application's metrics. The ratios that are calculated include Support Rate per Function Points, Application Reliability, Mean Time to Repair, Maintenance Cost per Function Point, and Repair Cost Ratio. The Application attributes that make up the processes in the process model tracked for the application include teams 7.10 and support work environment 7.11.

As explained in detail previously herein, no other measurement software integrates all the elements of the process model as the present invention does.

Figure 8:
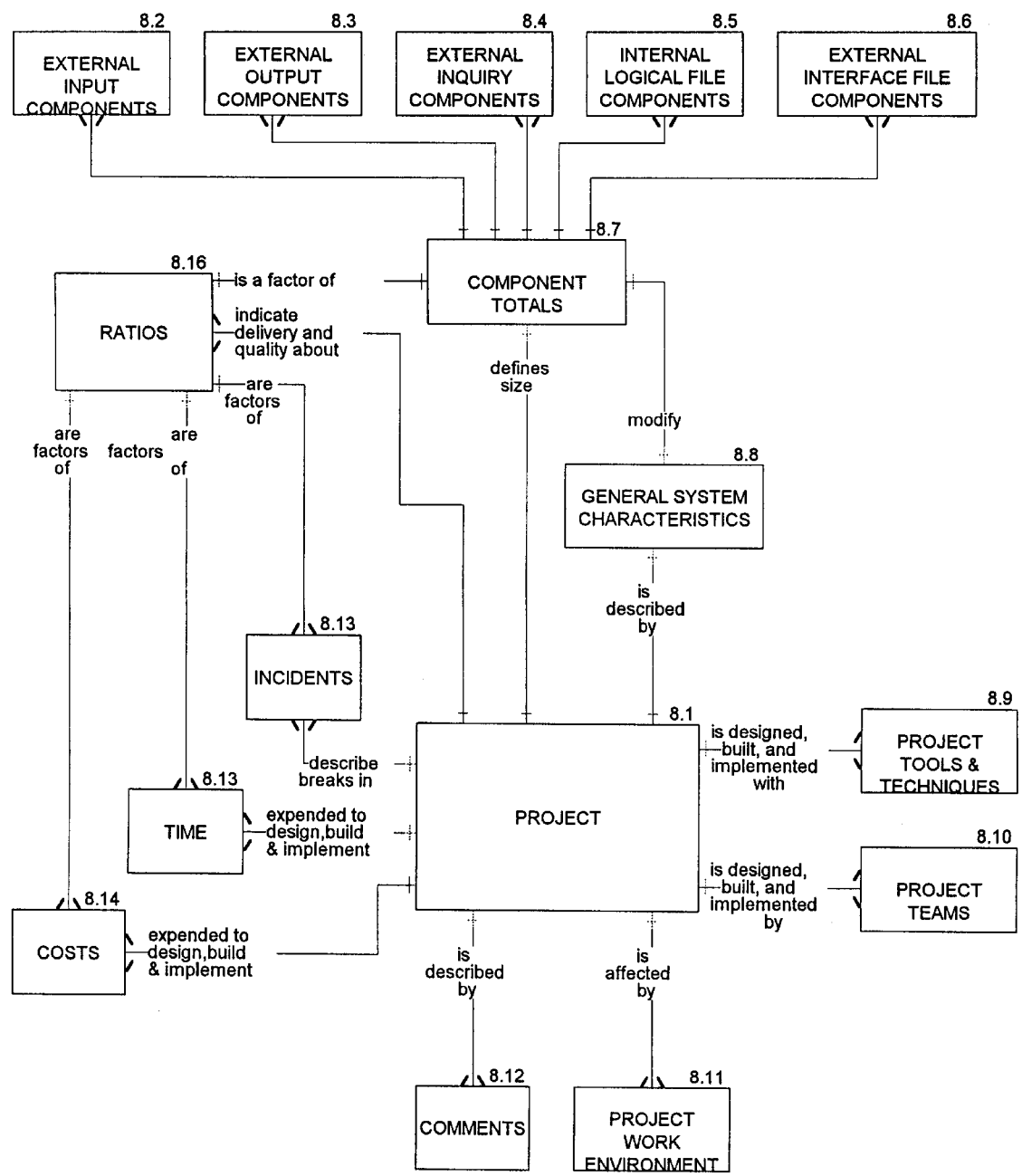
FIG. 8 is an entity relationship diagram showing the integrated application data sets according to the present invention for the project level.

Turning now to the project level, FIG. 8 is an entity-relationship diagram showing the integrated application data sets according the present invention. Each rectangle in FIG. 8 represents a logical collection of data. The connecting lines indicate a relationship. The marks at the extremes of the connecting line show the nature of the relationship, i.e. a single intersecting line at both ends denotes a one-to-one relationship between records, a "crow's foot" at both ends represents a many-to-many relationship, a single intersecting line at one end and a "crow's foot" at the other end shows that a one-to-many relationship exists.

The present invention automates the elements of process model, previously described herein, for the project level, project having been previously defined herein. The following function point measurement components are tracked for the project 8.1: external inputs 8.2, external outputs 8.3, external inquiries 8.4, internal logical file 8.5, and external logical files 8.6. The present invention performs the calculations outlined previously herein, to produce the unadjusted function point count, which is stored in component totals 8.7. The user then rates the fourteen General System Characteristics to determine the value adjustment factor 8.8. The present invention multiplies the unadjusted function point count by the value adjustment factor to determine the adjusted function point count, which is also stored in component totals 8.7.

In addition to function points, projects in the present invention contain the following measures: time 8.13, cost 8.14, and failure incidents 8.15. This measurement information is entered into the project record by the user. Ratios are the performance indicator metrics for the project 8.16. As in the process model, the present invention's project ratios are calculated from project measurement information. Metrics that are tracked for projects include: Delivery Rate, Duration Delivery Rate, Stability Ratio, Defect Detection Ratio, Defect Ratio, and Cost per function point. The following project attributes are tracked for the project: teams 8.10, project work environment 8.11, and project tools and techniques 8.9. In addition to these attributes, the user may record comments about the project 8.12.

As previously explained, no other measurement software integrates all the elements of the process model as the present invention does.

Figure 9A:
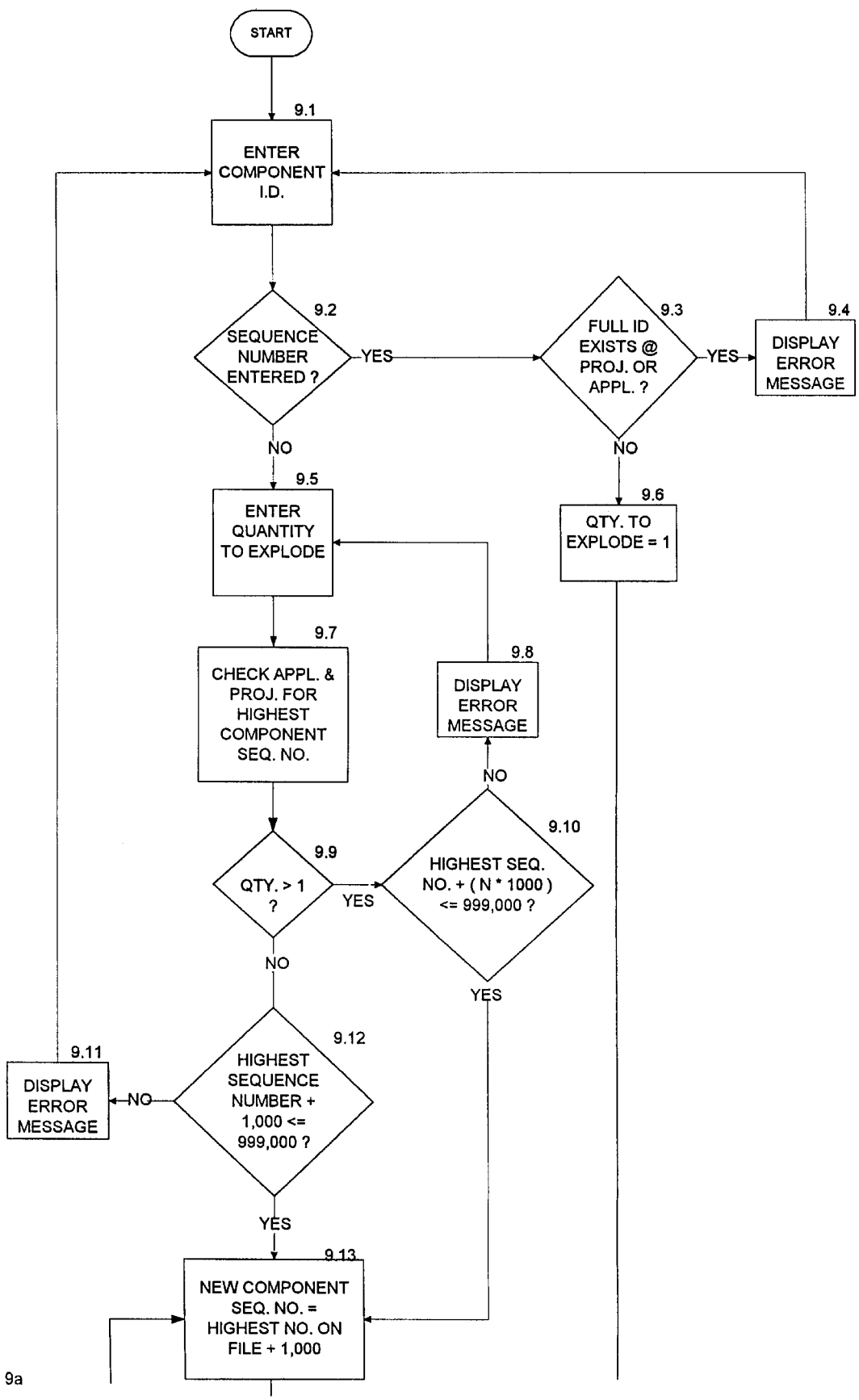
FIG. 9 is a flow chart illustrating component explosion of the add type according to the present invention.
Figure 9B:
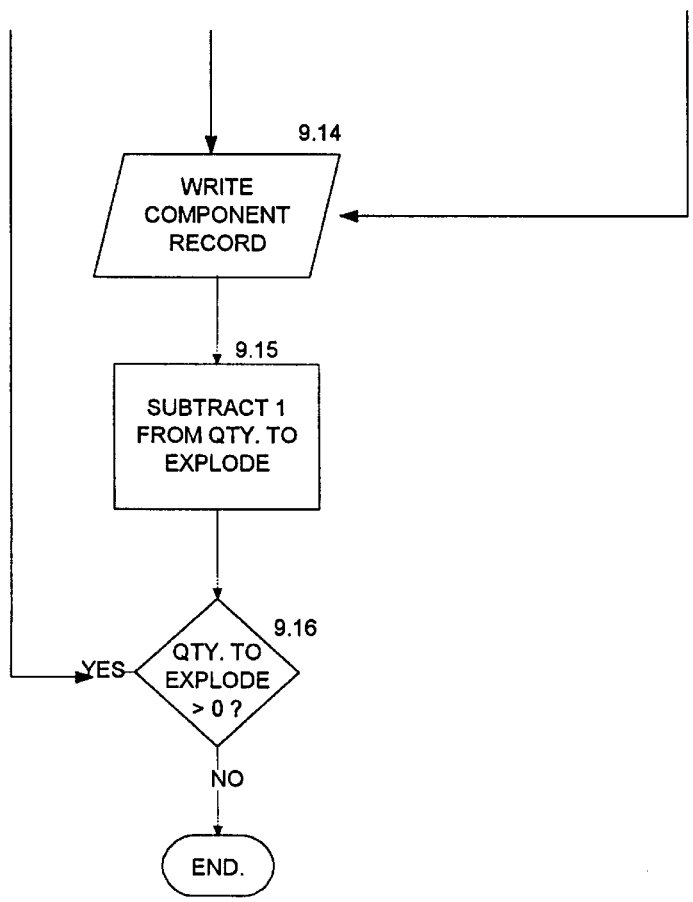

A second unique feature of the present invention is component explosion and it is of two basic types: add and maintenance. FIG. 9 is a flow chart of the technique used to refine summary level input for component information being added and generate detail component information according to the present invention. Arrows FIG. 9 point to the next action to be taken after the current step is complete. Rectangles indicate the action taken based on data or previous decision. Squares show input of data, diamonds illustrate a decision, and the parallelogram indicates addition of a new record to the file.

The best known prior art approach captured and stored component detail with a quantity factor. The newly constructed method introduced here takes such homogenous information and breaks it down to its smallest identifiable detail. The user enters the component ID 9.1 and quantity 9.5. The component ID consists of a prefix (maximum 8 alpha-numeric characters) 9.1 and a suffix (6 numeric characters). The suffix is the sequence code, and may be assigned by the invention or the user 9.2. For example, if the user assigns component ILF1 (prefix code) a quantity of 3, it is exploded by the invention as ILF1-001000, ILF1-002000, and ILF1-003000 as indicated in block 9.13. Following explosions of ILF1 begin at the next available sequence code (e.g. ILF1-004000). If the user defines the suffix sequence code, the component cannot be exploded 9.6. The invention then checks the application and project component records to determine the highest sequence number for that component ID 9.7. The quantity that the user enters in then checked 9.9, and the invention determines if the quantity multiplied by 1,000 (the sequence code) is greater than 999,000 as indicated in block 9.10. If the sequence code is greater than 999,000, an error message if displayed and the user must enter a new quantity 9.8.

If the sequence code is less than 999,000, after being multiplied by the quantity, the invention sets the highest sequence code for that component ID by adding 1,000 to the last component ID exploded 9.13. The component record is then written 9.14. The invention determines the number of components to explode and list by subtracting 1 from the quantity (if the user wants to explode one listing into four, the invention lists the original component and three components) 9.15. The component checks to ensure that the quantity is greater than zero and explodes the component 9.16.

As discussed in detail previously, no other function point tracking software has this explosion feature. It is considered a unique, distinguishing feature of the present invention.

Figure 10:
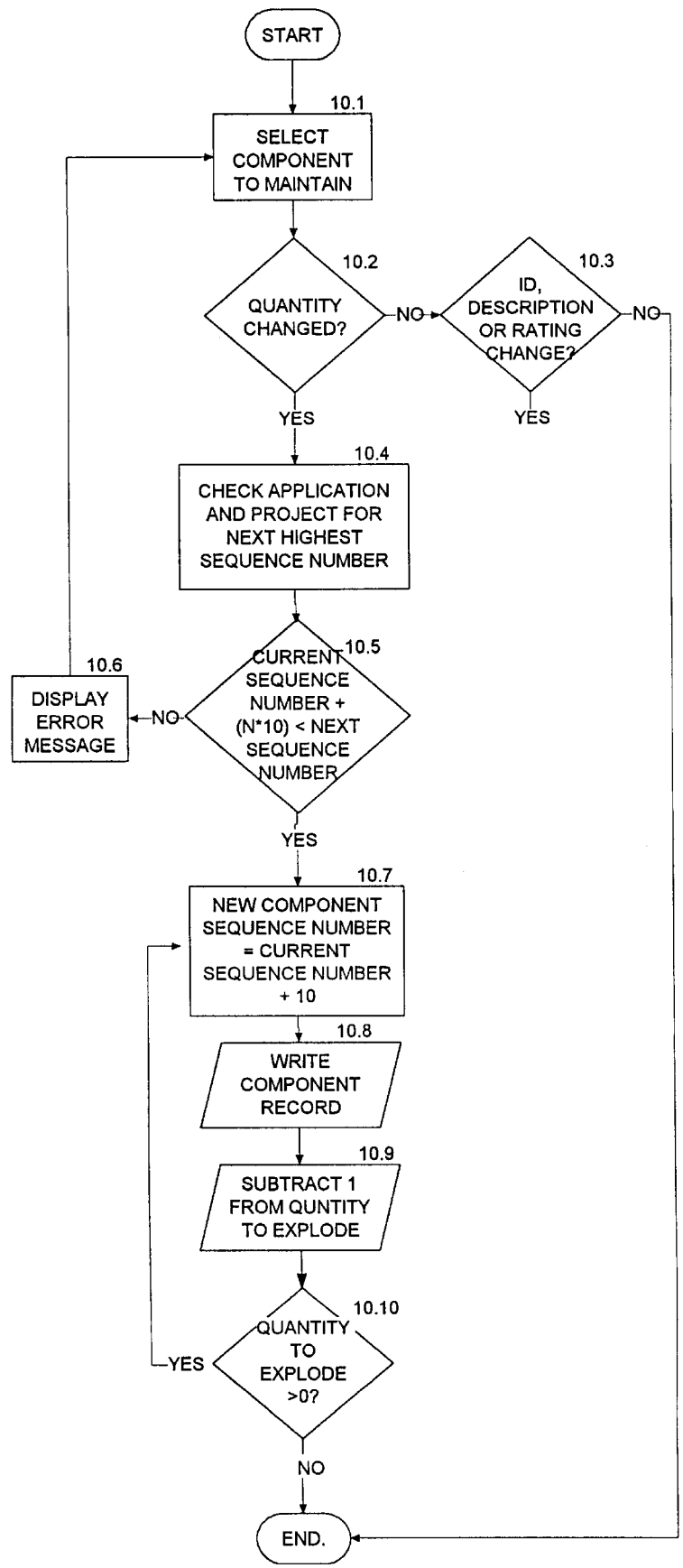
FIG. 10 is a flow chart illustrating component explosion of the maintenance type according to the present invention.
Figure 11A:
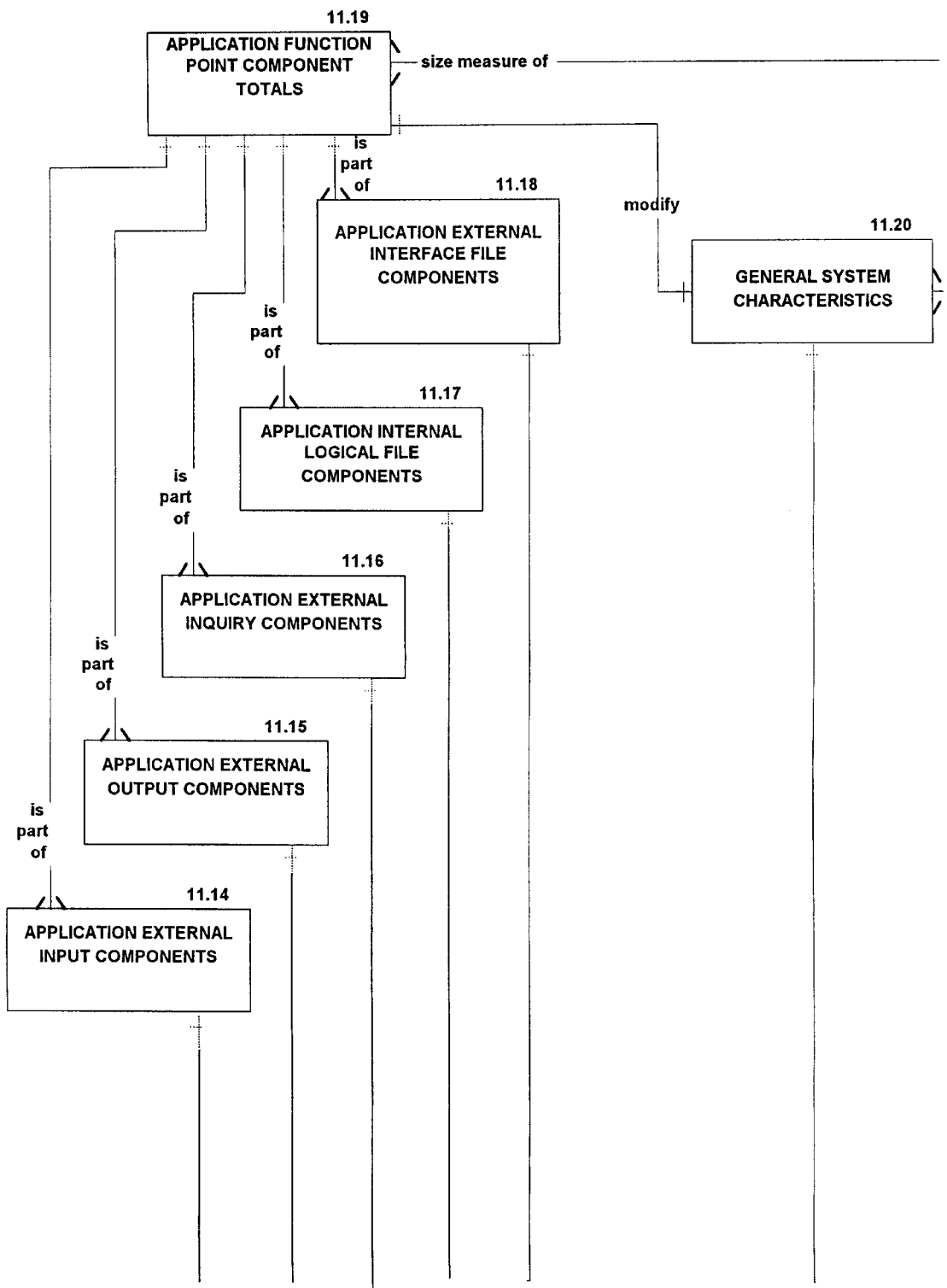
FIG. 11 is an entity relationship diagram showing mapping of project information to the application according to the present invention.
Figure 11B:
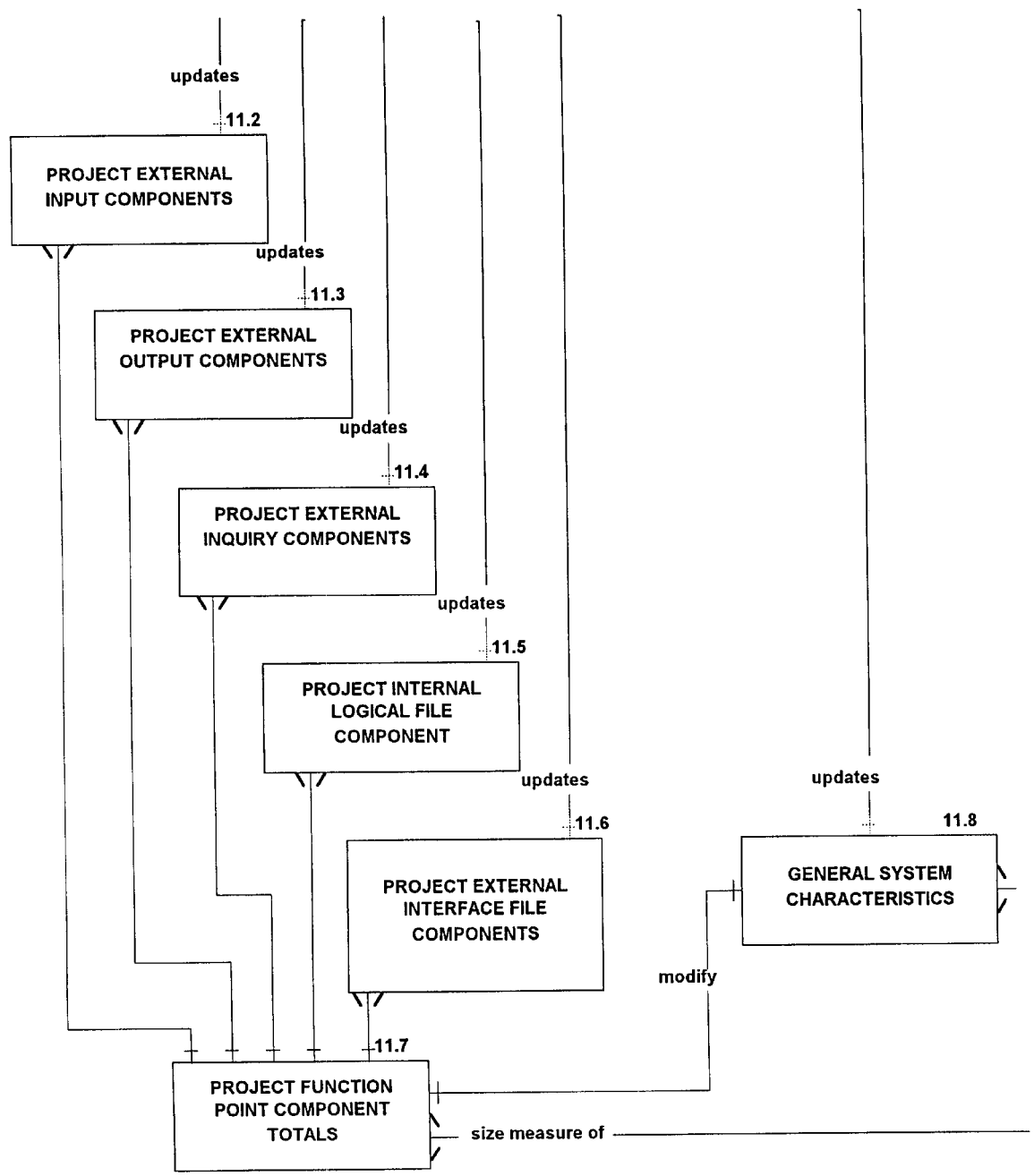
Figure 11C:
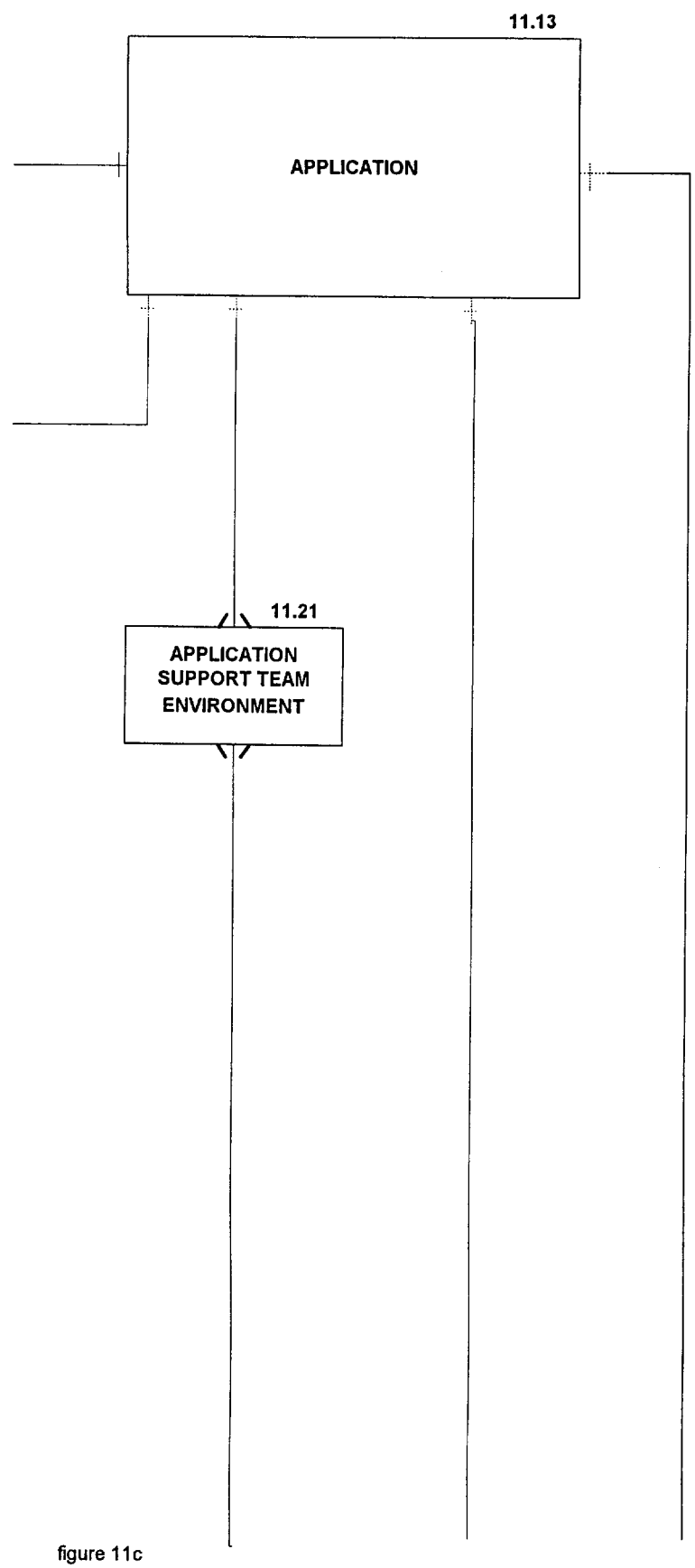
Figure 11D:
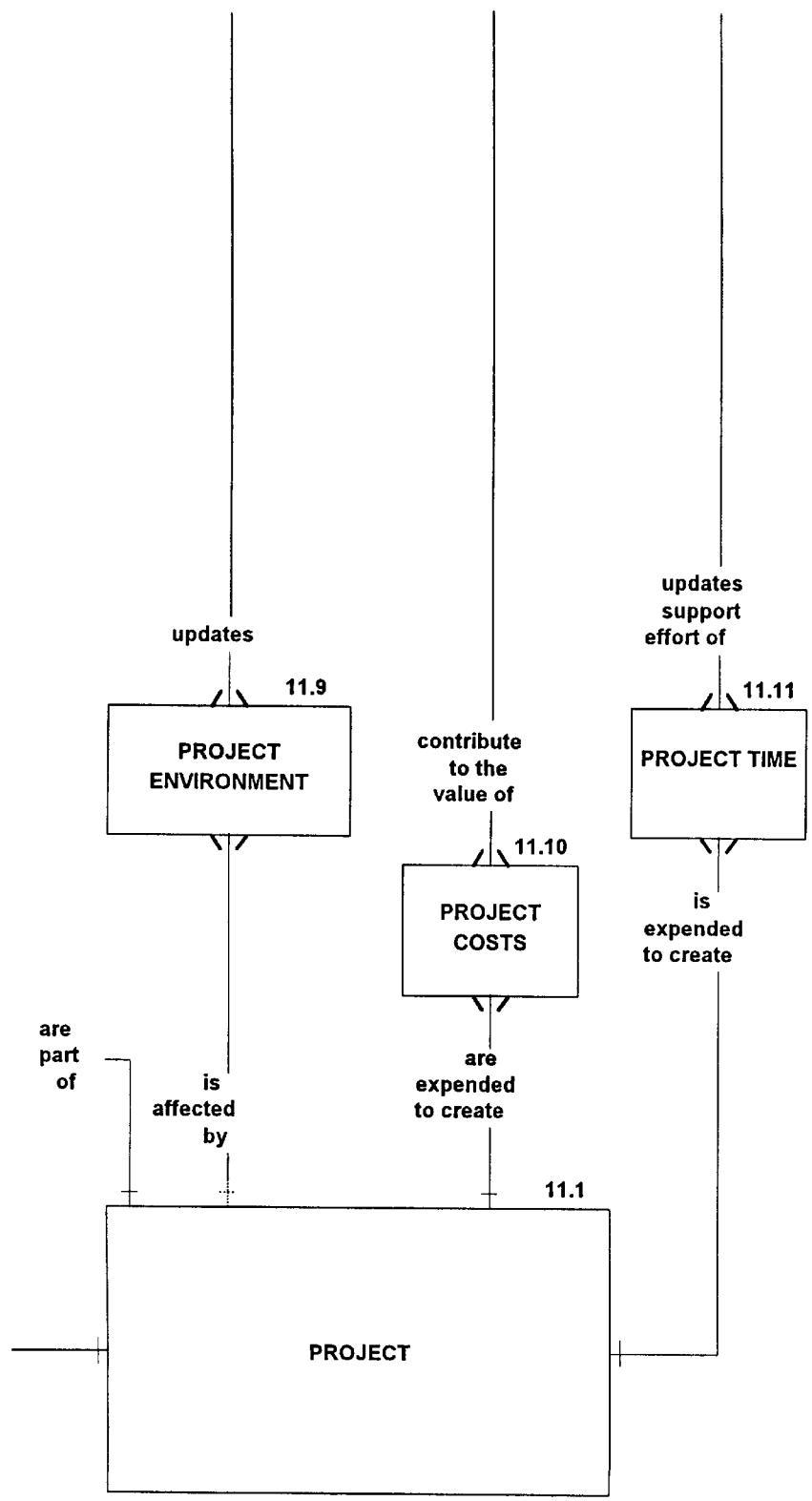

Turning now to the maintenance type of the explosion feature, FIG. 10 is a flow chart for the technique used to refine summary level input for component information being modified and generate detailed component information according to the present invention. Arrows in FIG. 10 point to the next action to be taken after the current step is complete. Rectangles indicate the action taken based on data or previous decision. Squares show input of data, diamonds illustrate a decision, and the parallelogram indicates addition of a new record to the file.

The best known prior art approach captured and stored component detail with a quantity factor. The newly constructed method introduced here takes such homogenous information and breaks it down to its smallest identifiable detail for maintenance. Maintenance occurs when an change is being made to an existing component. The user selects the component ID 10.1 that he or she wants to modify. The user modifies the quantity code 10.2 to re-explode the component. When the user explodes a component from a maintenance screen and the new components fall between two existing components, the sequence code is numbered by tens (e.g. if ILF1-002000, which falls between ILF1-001000 and ILF1-03000, is entered with a factor of three, the records generated will have the following IDs: ILF1-002000, ILF1-2010, ILF1-002020). This action is illustrated in FIG. 10 by blocks 10.4–10.7. The component record is then written 10.8, and the invention determines the number of exploded components to list by subtracting one from the quantity as indicated 10.9. If the quantity is greater than zero, the invention explodes the components 10.10.

As discussed in detail previously, no other function point tracking software has this explosion feature. It is considered a unique, distinguishing feature of the present invention.

A third unique feature of the present invention is accurate movement of data between applications and projects. The difference between application and project data, and the need to ensure the integrity of both for analysis has been discussed in detail previously. To automate the process model analysis method, the present invention introduces the accurate movement of data between projects and applications. There are five types of movement of data necessary to fully automate the process model; application update of a baseline or development project; application update of an enhancement project; application copy to an enhancement project; application copy to a baseline or development project; application update backout.

The provision of accurate movement of data according to the present invention enables the process model to be fully automated in a way that ensures the integrity of measurement information. As explained previously herein, no other measurement software accomplishes the accurate movement of data. This distinction applied to the five types of accurate movement of data listed herein above and which now will be described in detail.

FIG. 11 shows the relationship in the present invention between application and project data. In particular FIG. 11 is an entity relationship diagram showing mapping of project information to the application according to the present invention. Each rectangle in FIG. 11 represents a logical collection of data. The connecting lines indicate a relationship as follows: a single intersecting line at both ends denotes a one-to-one relationship between records; a "crow's foot" at both ends represents a many-to-many relationship; a single intersecting line at one end and a "crow's foot" at the other end shows that a one-to-many relationship exists.

The structural relationship between applications and project according to the present invention enables the user to create and maintain applications 11.13 and projects 11.1 as separate, yet related entities. Information that has been entered by the user in a project data store modifies the corresponding application data store when the user selects an accurate movement of data action, which will be described presently. This structure makes the unique accurate movement of data possible.

The present invention directly relates project and application function point component information, as illustrated in project data stores 11.2–11.6 and application data stores 11.14–11.18. Project function point totals and application function point totals are provided as indicated in blocks 11.7 and 11.19, respectively. In addition to the component data, application and project general system characteristic data is related, as shown in blocks 11.8 and 11.20. Project cost and time data, data stores 11.10 and 11.11, update the application during an accurate movement of data action. The present invention also relates environment attribute information between an application and project as indicated by blocks 11.9 and 11.21.

Figure 12:
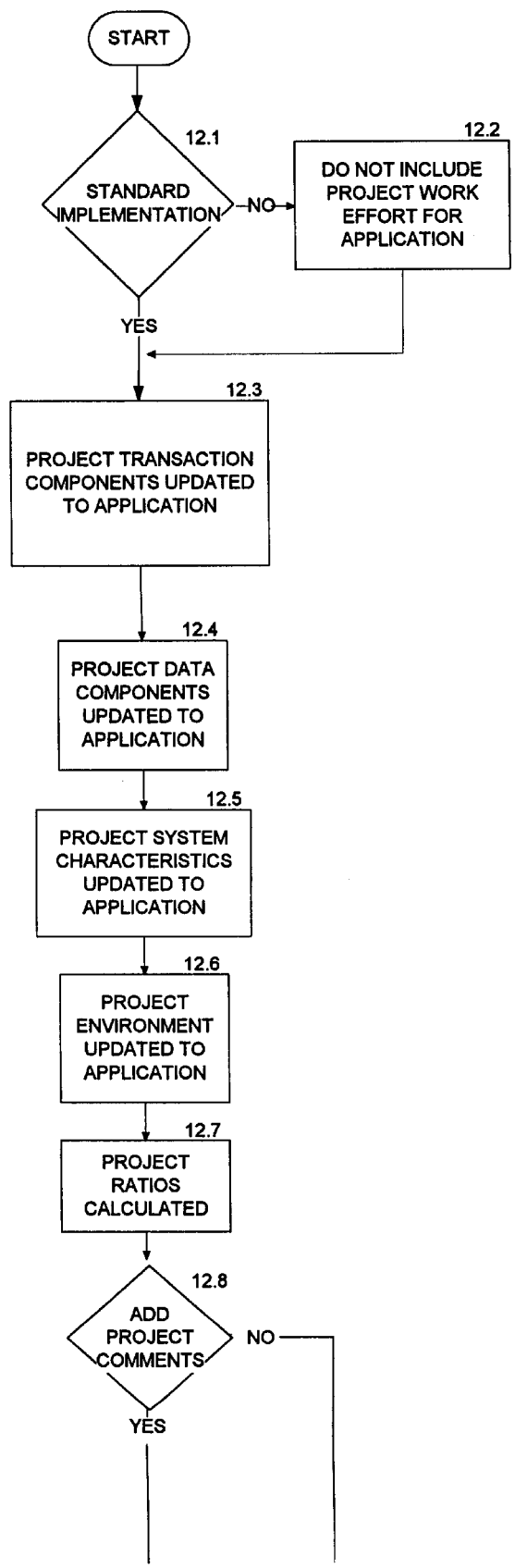
FIG. 12 is a flow chart of the process used by the present invention to update enhancement project information to the application.
Figure 12:
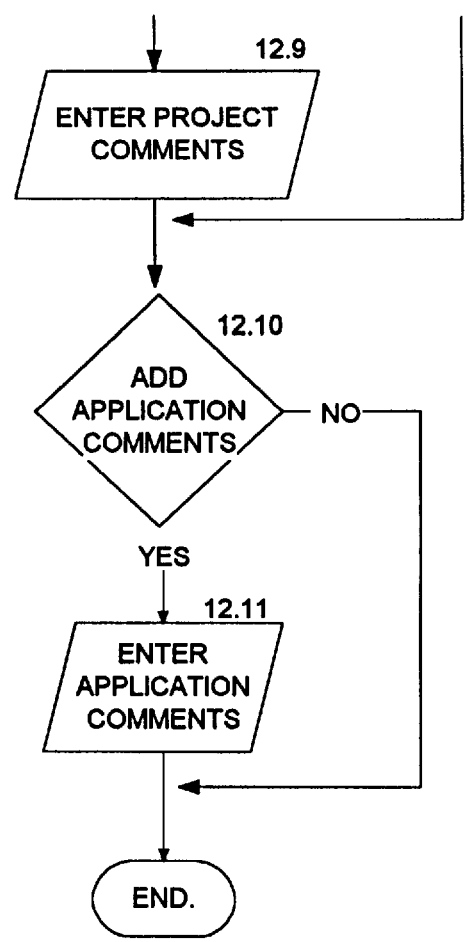

Turning now to the five types of movement of data to fully automate the process model, the first is accurate movement of data—baseline, development project update to an application. FIG. 12 is a detailed flow chart of the process used by the present invention to update the initial set of project information to the application. Arrows in FIG. 12 point to the next action to be taken after the current step is complete. Rectangles indicate the action taken based on data or previous decision. Squares show input of data, diamonds illustrate a decision, and the parallelogram indicates addition of a new record to the file.

Software applications are developed and maintained by projects. Application Update of a baseline or development project enables the user to move the recorded measurement, metric, and attribute data from the project to the application. This type of Update is used for baseline and development projects only.

The user begins the process by selecting a standard implementation, where project data is tallied for the project record and then updated to the application, or a non standard implementation. If the implementation is not standard, the project data is tallied for the project record, but is not updated for the application 12.2. The project transaction components, which include external inputs, external outputs, and external inquiries, are updated to the application 12.3. The project data components, which include internal logical files and external interface files are then updated to the application 12.4, as are the project general system characteristics 12.5. The only attribute information that is update to the application is work environment 12.6. Information about project tools, tools, and techniques are not carried to the application. The project ratios are then calculated for before the update process is complete 12.7. The user then has the option to add project and application general comments 12.8–12.11.

Figure 13A:
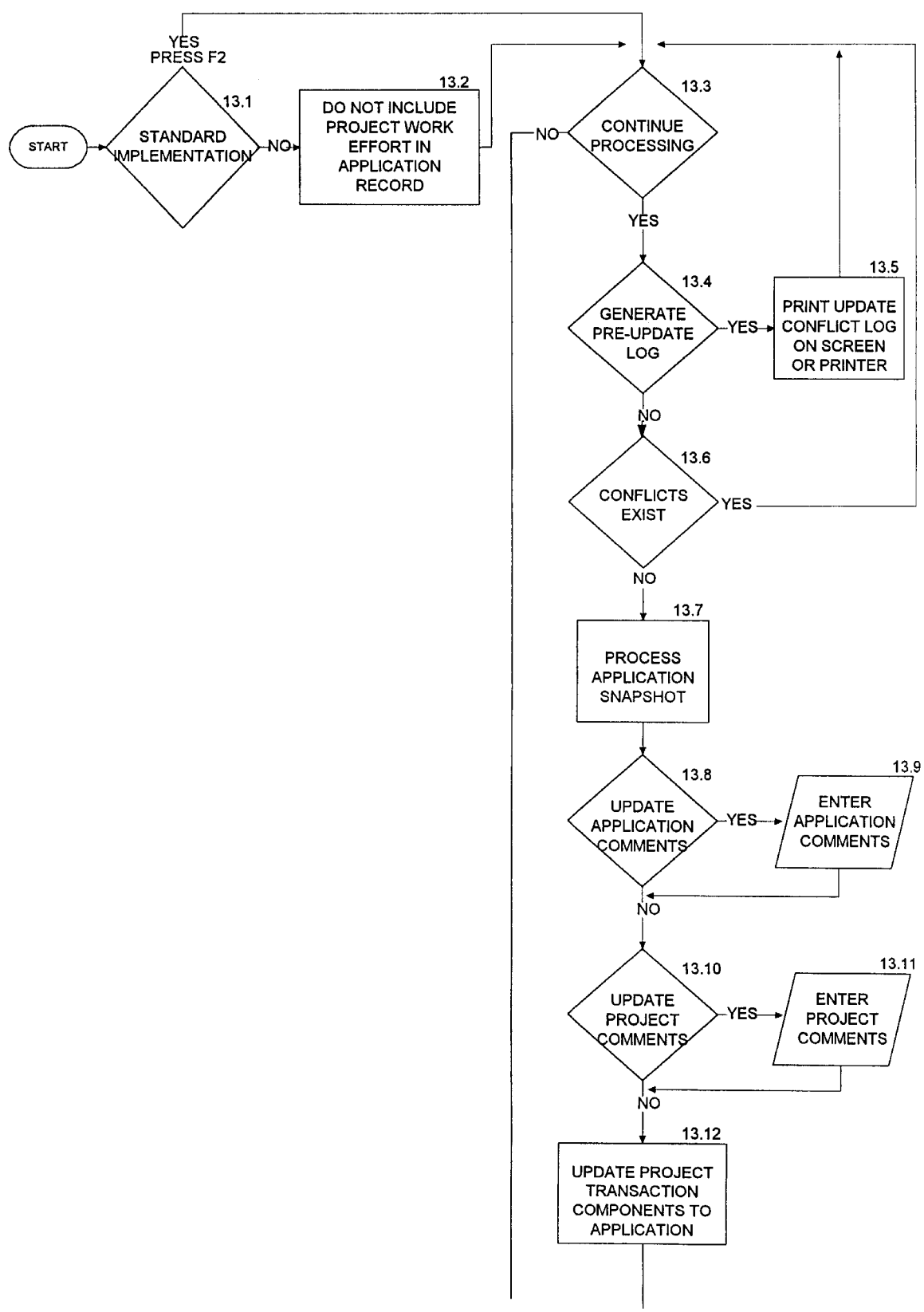
FIG. 13 is a flow chart of the process used by the present invention to update enhancement project information to the application.
Figure 13B:
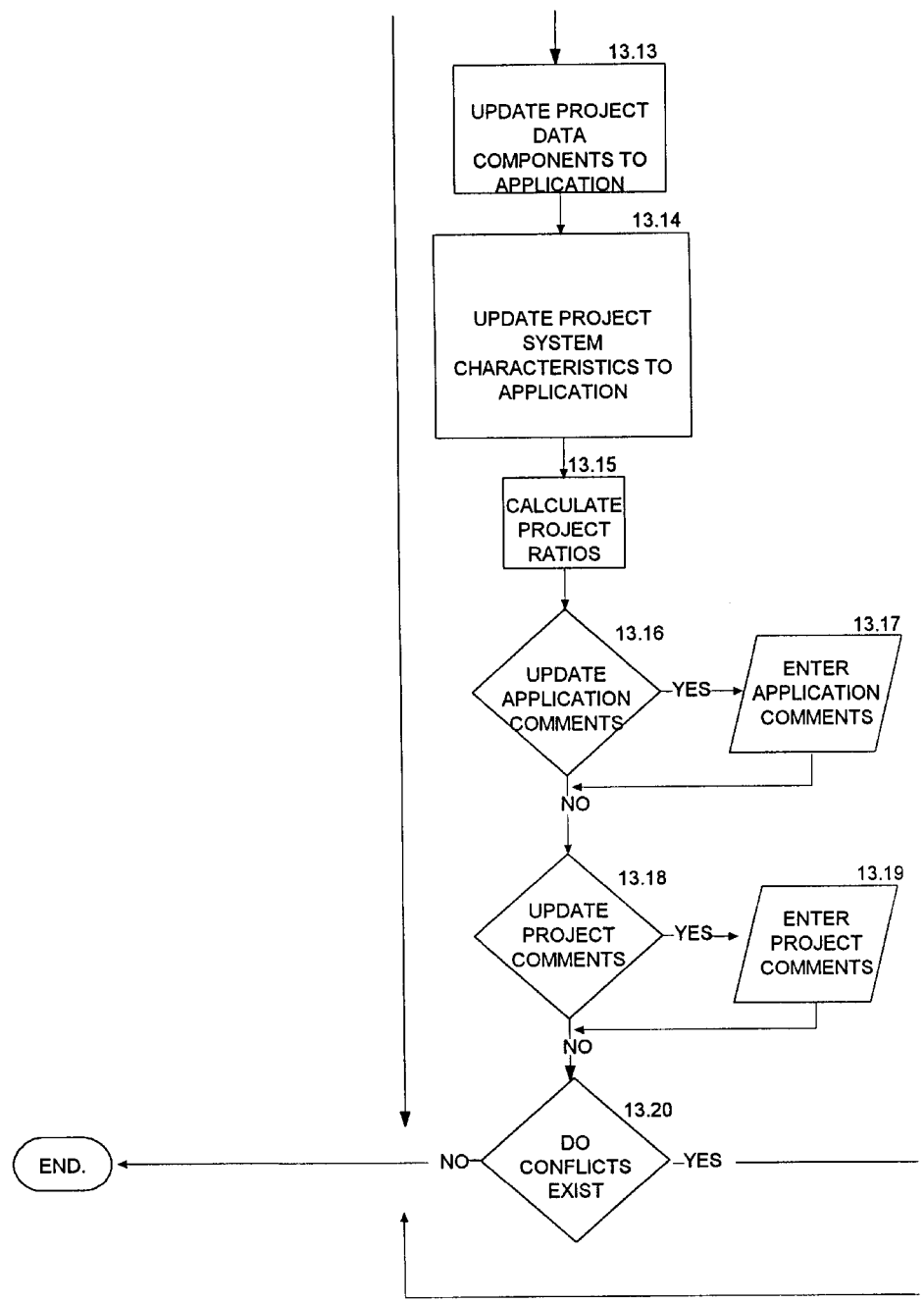
Figure 13C:
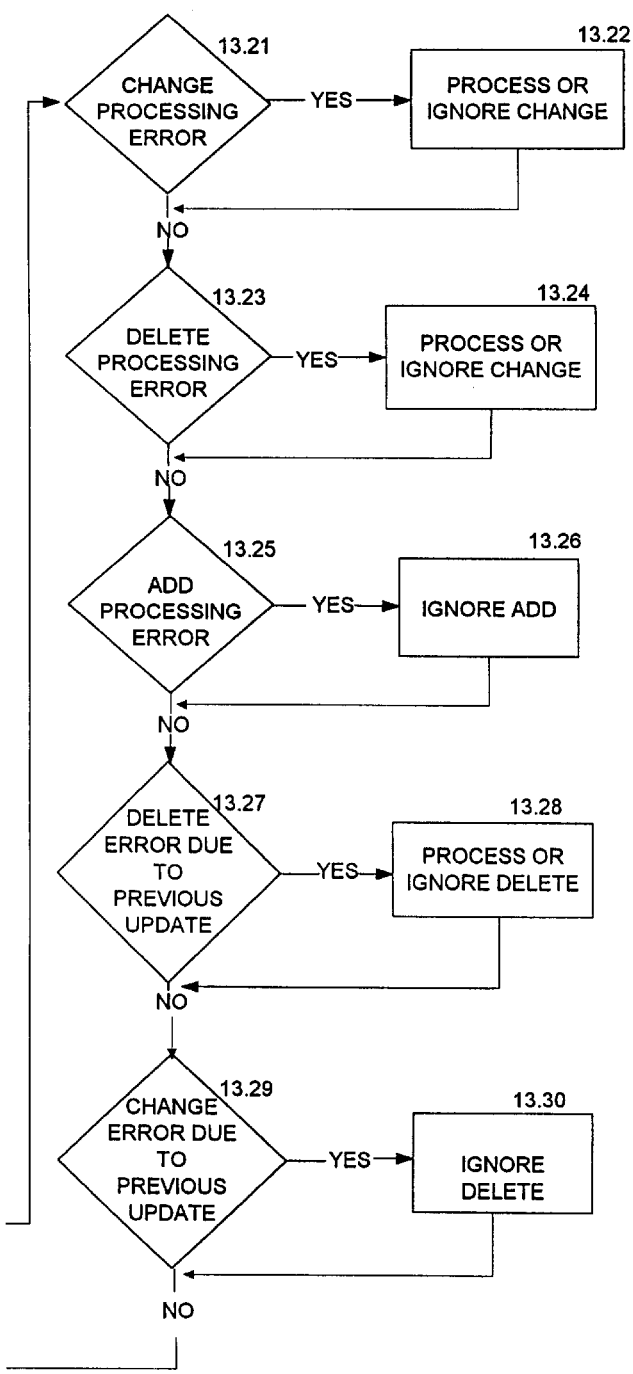

The second type of movement of data is accurate movement of data—application update of an enhancement project. FIG. 13 is a flow chart of the process used by the present invention to update enhancement project information to the application. Arrows FIG. 13 point to the next action to be taken after the current step is complete. Rectangles indicate the action taken based on data or previous decision. Squares show input of data, diamonds illustrate a decision, and the parallelogram indicates addition of a new record to the file.

The user indicates if the implementation of the project is a standard one (it will be calculated in the application's work product) or is a terminated one (the project's work product is calculated, but not included in the application's work product). This is indicated in blocks 13.1 and 13.2. The user can generate a pre-update log. This report, displayed on the screen or printed, lists update conflicts resulting from data newly entered or modified 13.4 and 13.5. Conflicts occur when an action the user is trying to update was changed by a previous application update. If conflicts do exist, the user can choose to continue or terminate the update process as indicated by decision block 13.6. If the user continues an update, an application snapshot is taken 13.7. The user has the opportunity to update comments regarding the application and project 13.8–13.11. The project transaction components, data components, and system characteristics are updated to the application (13.12–13.14). The user can then update application and project comments 13.16–13.19. A unique feature of this part of the invention is the conflict resolution opportunities presented to the user as illustrated by blocks 13.21–13.30.

Figure 14:
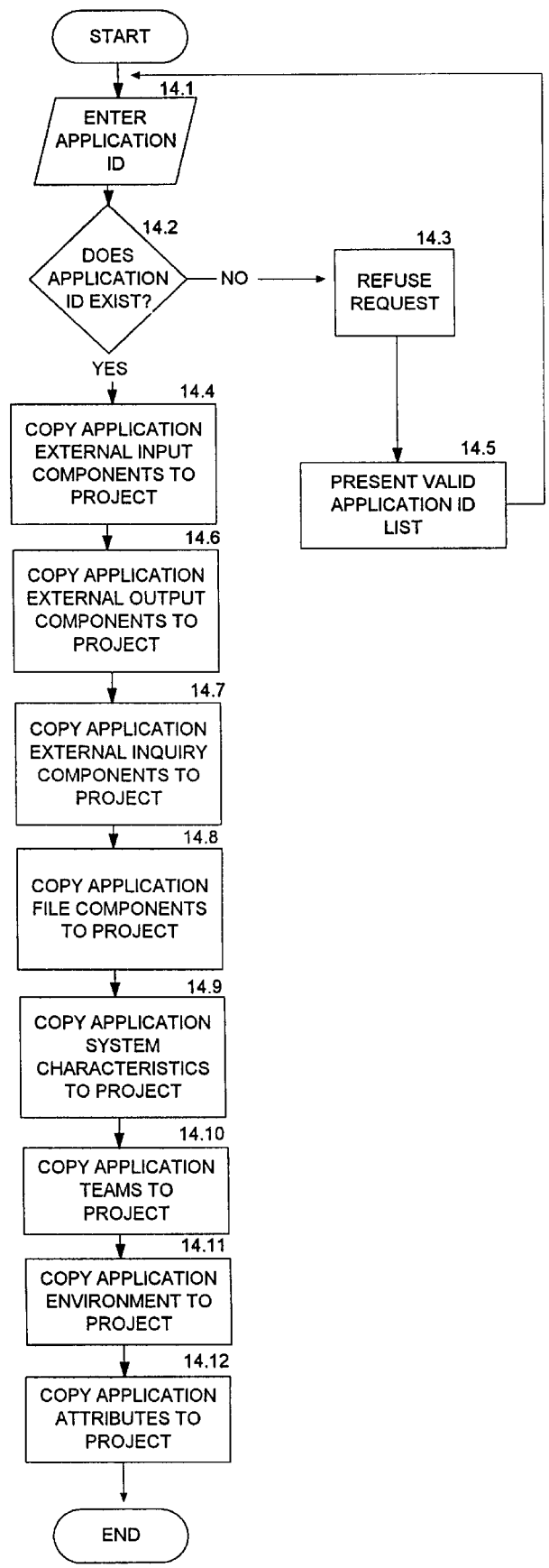
FIG. 14 is a flow chart of the process used by the present invention to create a development project copying application details.

The third type of movement of data is accurate movement of data—application copy to a baseline, development project. FIG. 14 is a flow chart of the process used by the present invention to create a development project copying application details. Arrows in FIG. 14 point to the next action to be taken after the current step is complete. Rectangles indicate the action taken based on data or previous decision. Squares show input of data, diamonds illustrate a decision, and the parallelogram indicates addition of a new record to the file.

The invention of the Accurate Movement of Data Between Applications and Projects includes the Application Copy to a Baseline, Development Project. This action creates a project with information copied from an unrelated application. The user selects the application he or she wants to copy 14.1. The invention validates the request 14.2, and if the application does not exist the request is refused 14.3 and the user is presented a list of valid applications 14.5.

Once a valid application is selected, the application components are copied to the project (external inputs 14.4, external outputs 14.6, external inquiries 14.7, internal logical files 14.8, and external interface files 14.8). The application's general system characteristics are then copied to the project 14.9. The application work environment characteristics are copied to the project 14.11. The application's attributes are copied to and stored in the project record 14.12.

Figure 15A:
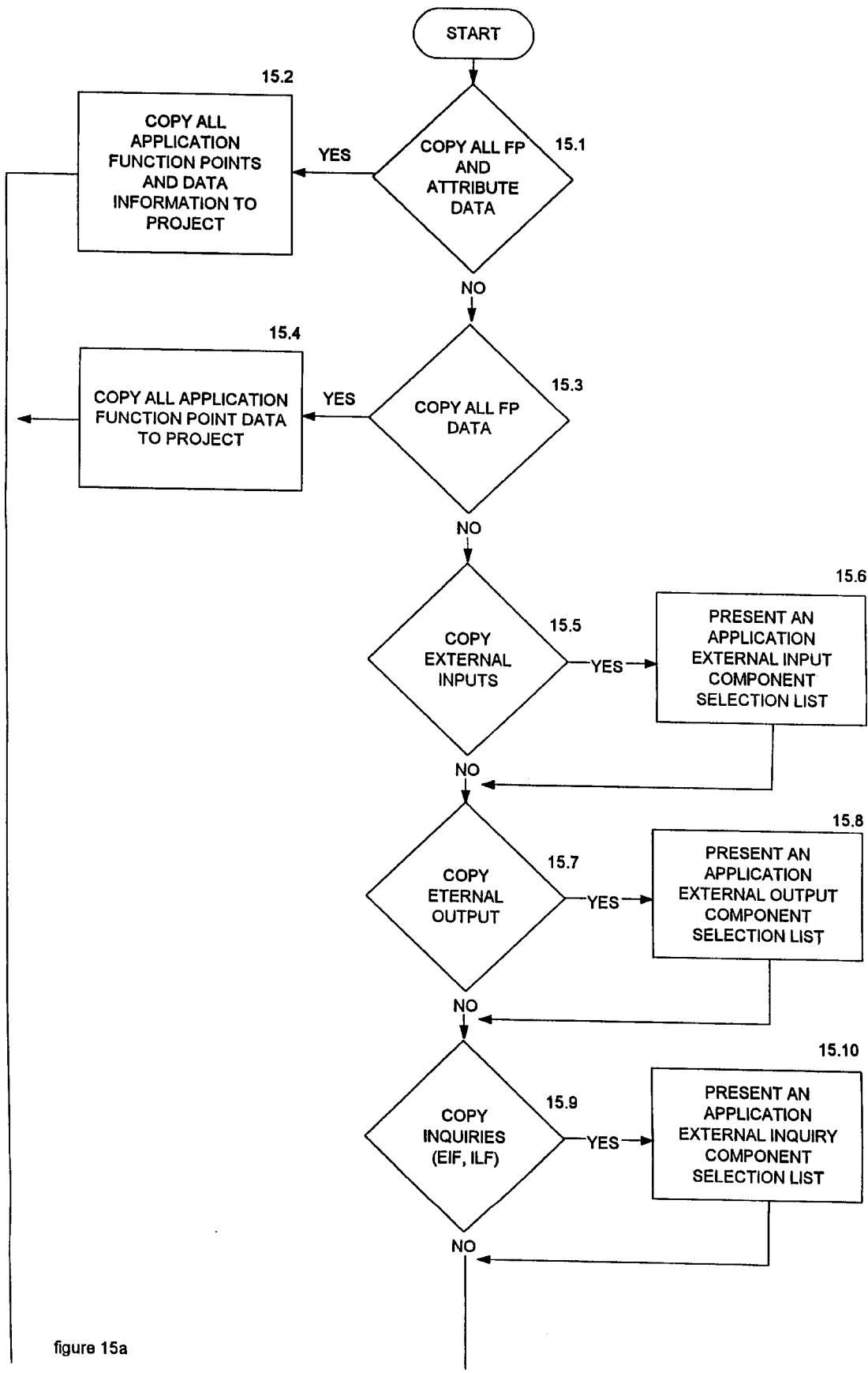
FIG. 15 is a flow chart of the process used by the present invention to create an enhancement project copying application that are to be modified.
Figure 15B:
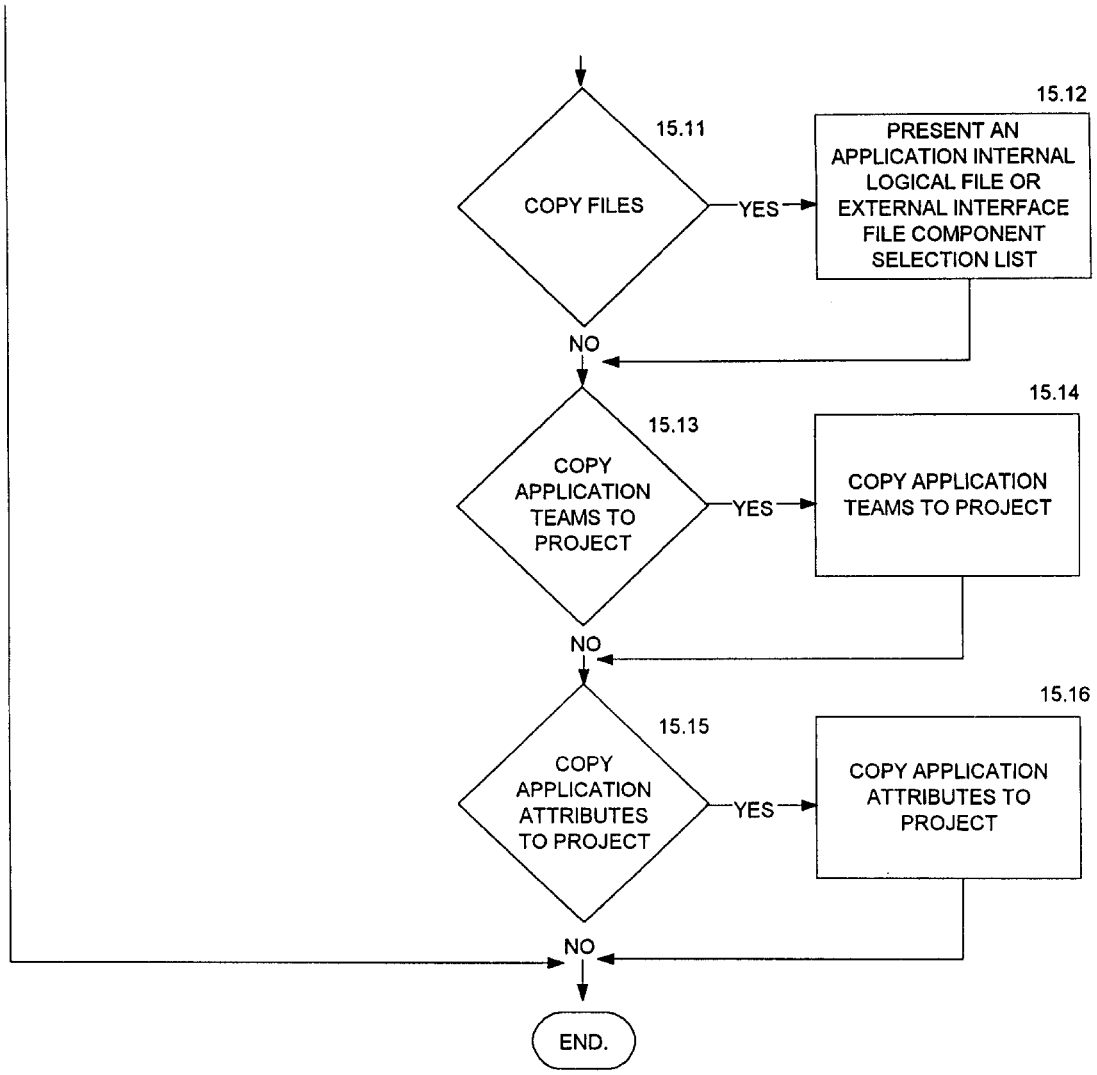

The fourth type of movement of data is accurate movement of data—application copy to an enhancement project. FIG. 15 is a flow chart of the process used by the present invention to create an enhancement project copying application details that are to be modified. Arrows in FIG. 15 point to the next action to be taken after the current step is complete. Rectangles indicate the action taken based on data or previous decision. Squares show input of data, diamonds illustrate a decision, and the parallelogram indicates addition of a new record to the file.

This type of accurate movement of data is used to copy application information to an enhancement project for maintenance. The user is presented with a list of application data choices that can be copied to the application. In particular, if the user answers yes to the Copy All Function Point and Attribute Data request 15.1, the application's external inputs, external outputs, external inquiries, internal logical files, external interface files, team data, and attribute data will be copied to the project 15.2. Copy All Function Point Data 15.3 copies the application's external input, external output, external inquiry, internal logical file, and external logical file data to the project 15.4.

If the user selects Copy External Inputs 15.5, there will be presented a list of the application's external input to select 15.6. When the user processes the copy request, the selected components are copied to the project. If the user selects Copy External Outputs 15.7, he or she will be presented a list of the application's external output components to select 15.8. When the user processes the copy request, the selected components are copied to the project. If the user selects Copy External Inquiries 15.9, there will be presented a list of the application's external output components to select 15.10. When the user processes the copy request, the selected components are copied to the project.

If the user selects Copy Files 15.11, there she will be presented a list of the application's internal logical file and external interface components to select 15.12. When the user processes the copy request, the selected components are copied to the project. If the user selects Copy Application Teams to Project 15.13, the application team data is copied to the enhancement project 15.14. If the user selects Copy Application Attributes to Project 15.15, the application's attribute information is copied to the project.

Figure 16:
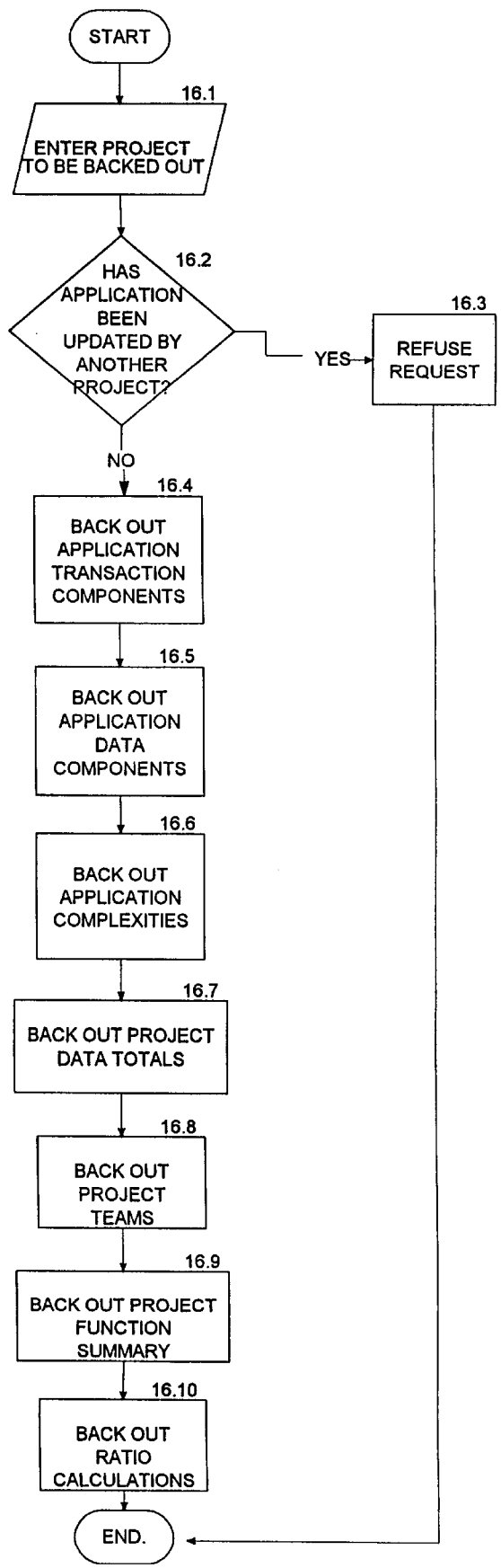
FIG. 16 is a flow chart of the method used by the present invention to reverse the effects for the last project update to the application.

The fifth type of movement of data is accurate movement of data—application update backout. FIG. 16 is a flow chart of the method used by the current invention to reverse the effects for the last project update on the application. Arrows in FIG. 16 point to the next action to be taken after the current step is complete. Rectangles indicate the action taken based on data or previous decision. Squares show input of data, diamonds illustrate a decision, and the parallelogram indicates addition of a new record to the file.

By virtue of this fifth type of data movement, the invention enables the system administrator to back out an update. The user enters the project ID to be removed from the application 16.1. The project can be backed out only if the application has not been updated by subsequent project 16.2 and 16.3. The project information withdrawn from the application includes: transaction components, data components, complexities, totals, teams, function summary, and ratio calculations indicated in blocks 16.4–16.10, respectively.

A fourth unique feature of the present invention is report flagging for applications and projects. In particular, the present invention also provides the user with unique capabilities for reporting measurement data for the organizational levels shown in FIG. 3. The present invention enables the user to exclude certain projects and applications from reporting. There are times when adjustment projects are created to correct erroneous application or project size. Similarly, sample application and project records are generated to be used as patterns for data capture and modeling. In order to prevent these from distorting the metric analysis reports, the present invention provides an analysis flag to give administrators the ability to exclude those applications or projects.

Figure 17:
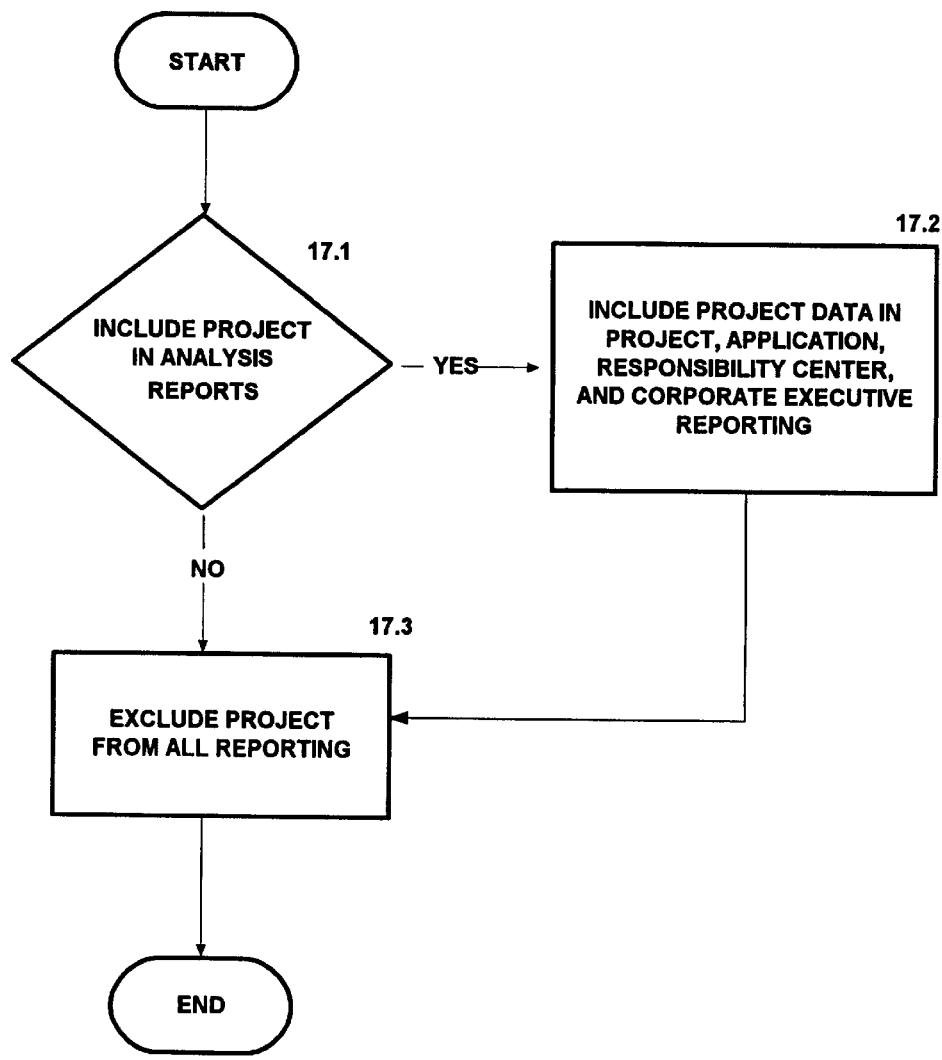
FIG. 17 is a flow chart illustrating the project analysis flag according to the present invention.

The project analysis flag illustrated in FIG. 17 presents the user with the option to include or exclude a project from reporting and analysis 17.1. If the user decides to include the project, the project data will be included in project, application, responsibility center, organization, and corporate executive reports 17.2. If the user excludes the project, the project is not included in reporting 17.3.

Figure 18:
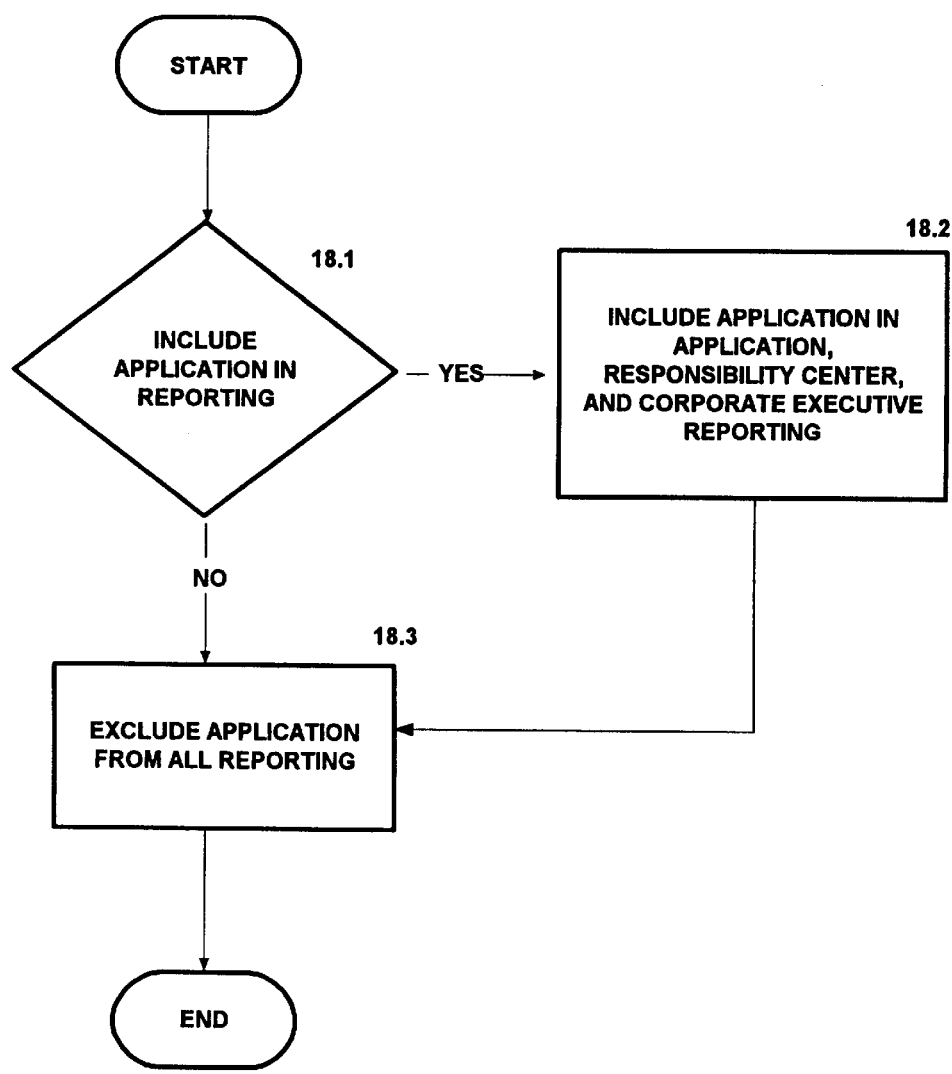
FIG. 18 is a flow chart illustrating the application analysis flag according to the present invention.
Figure 19A:
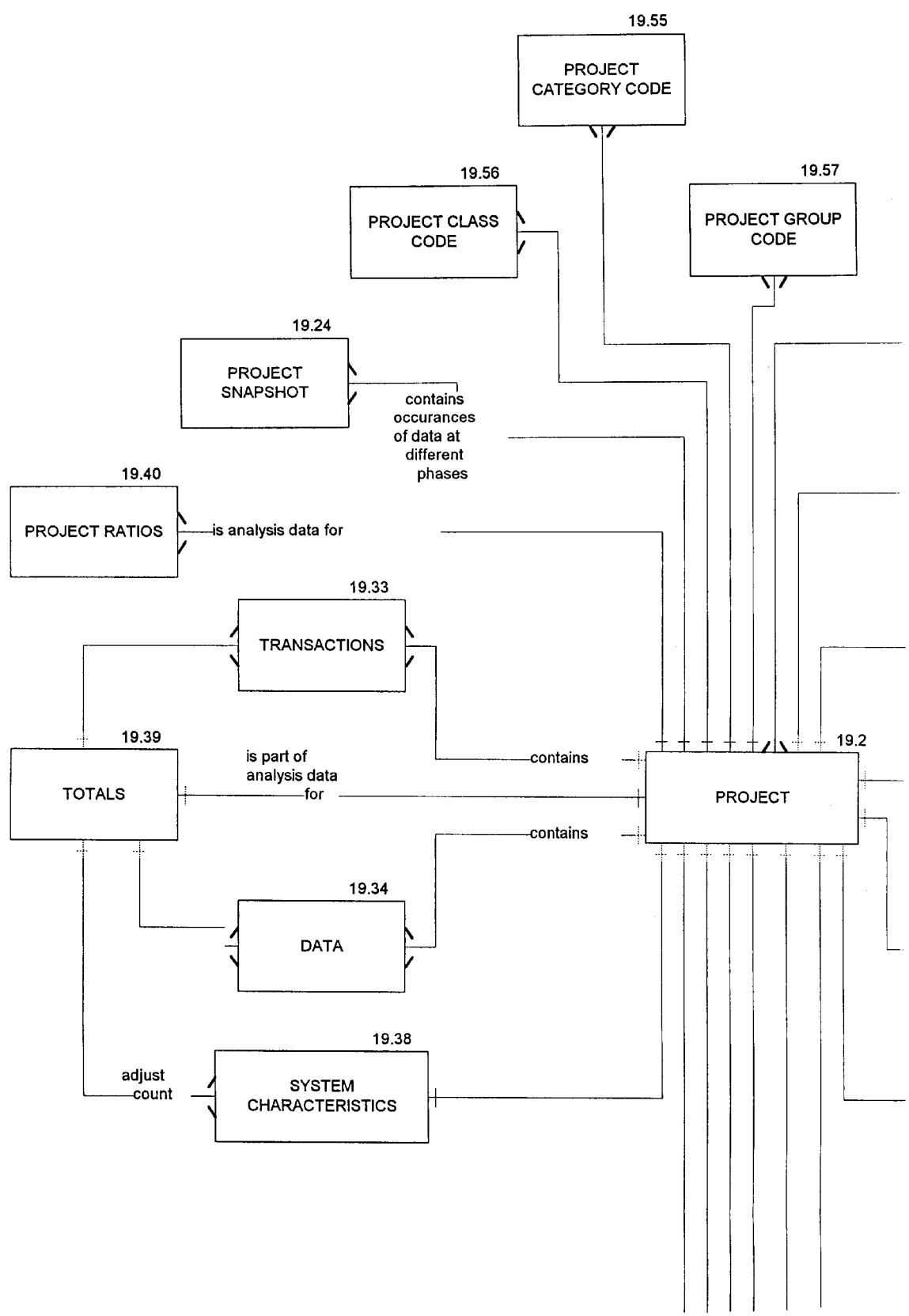
FIG. 19 is an entity relationship diagram further illustrating the present invention.
Figure 19B:
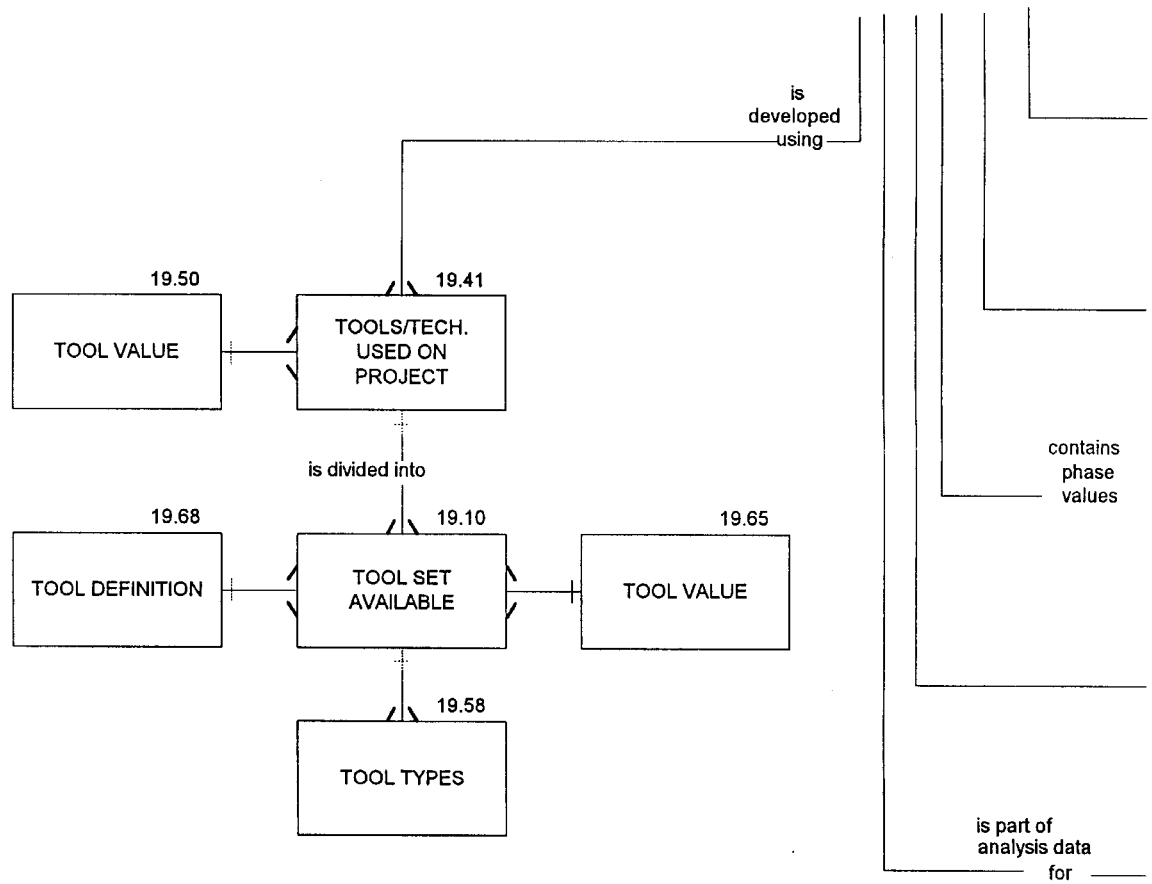
Figure 19C:
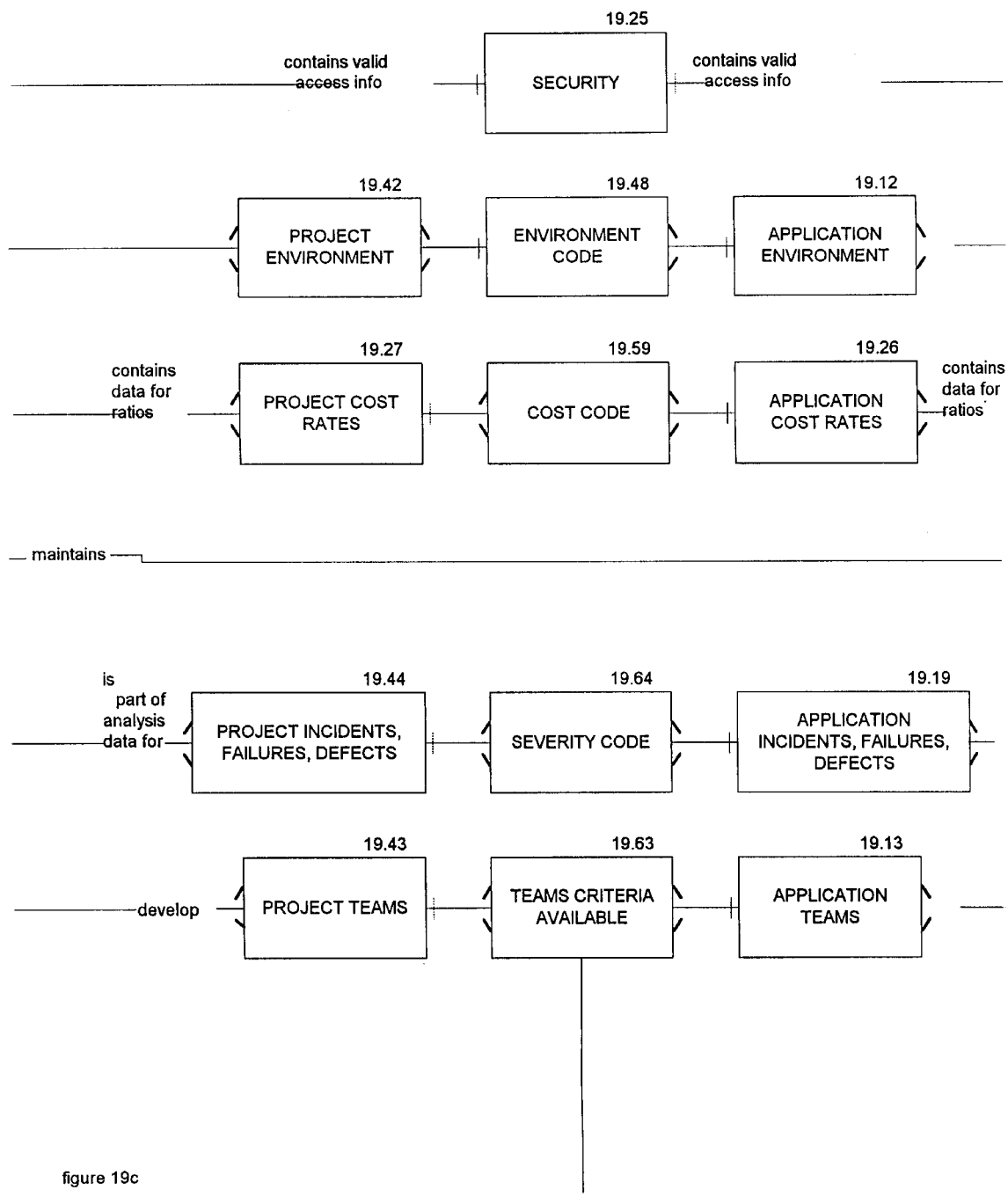
Figure 19D:
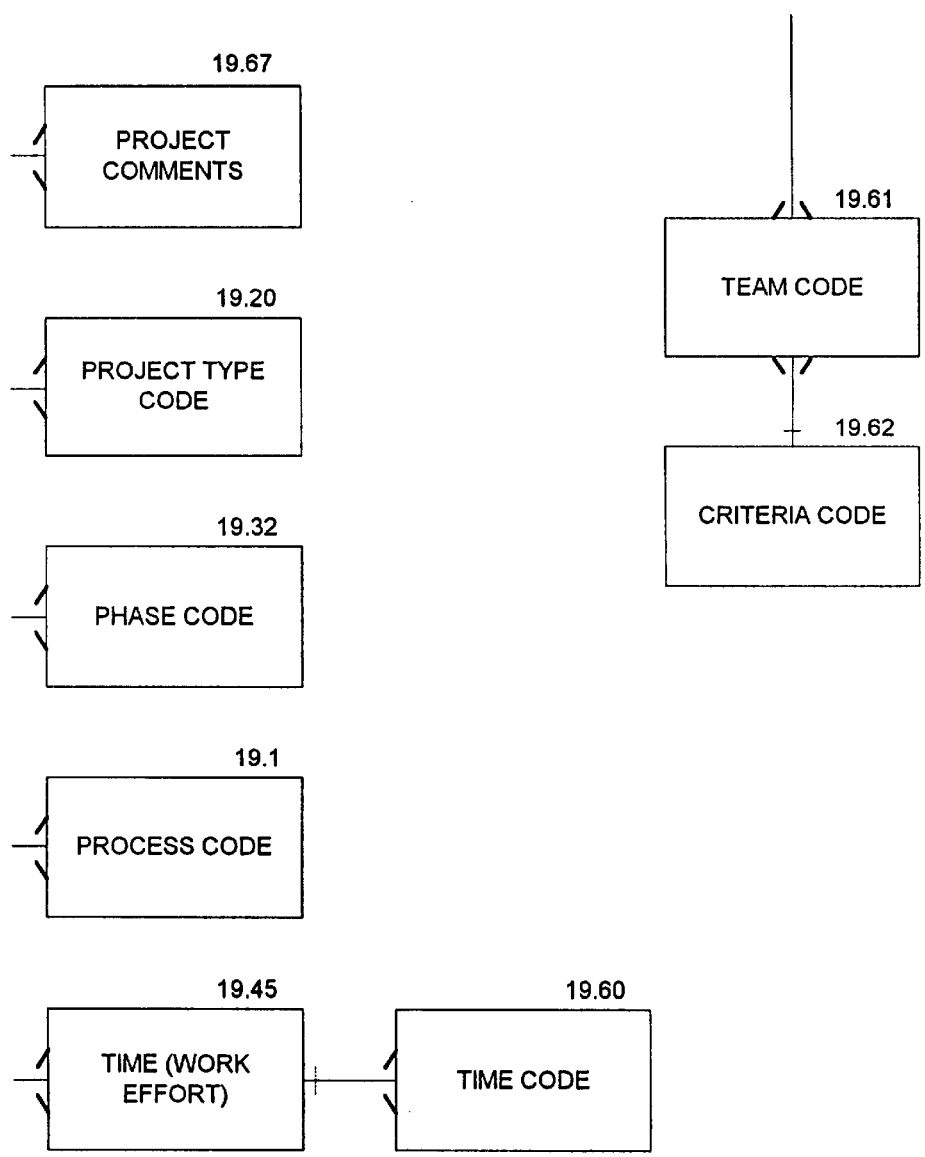
Figure 19E:
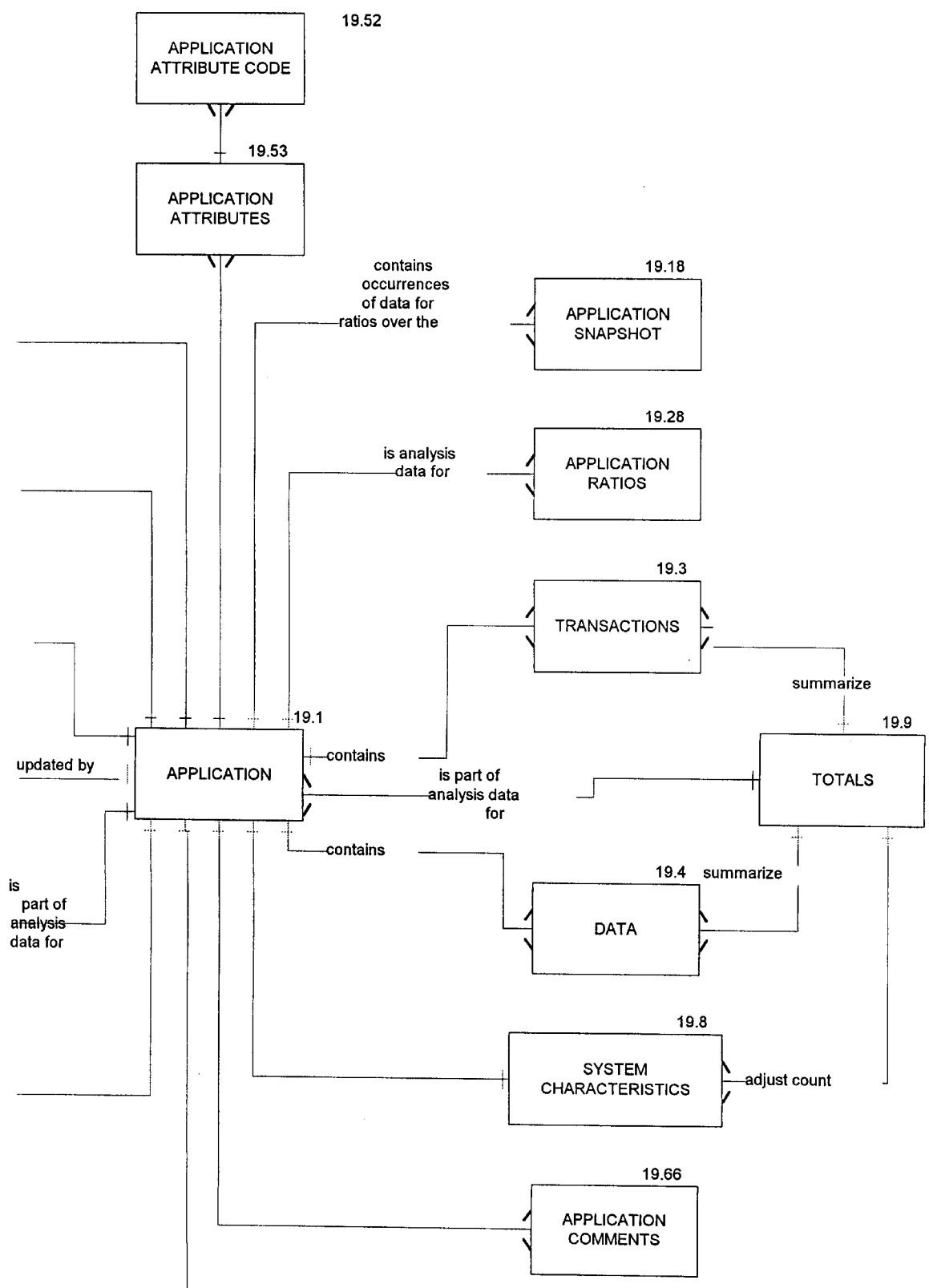
Figure 19F:
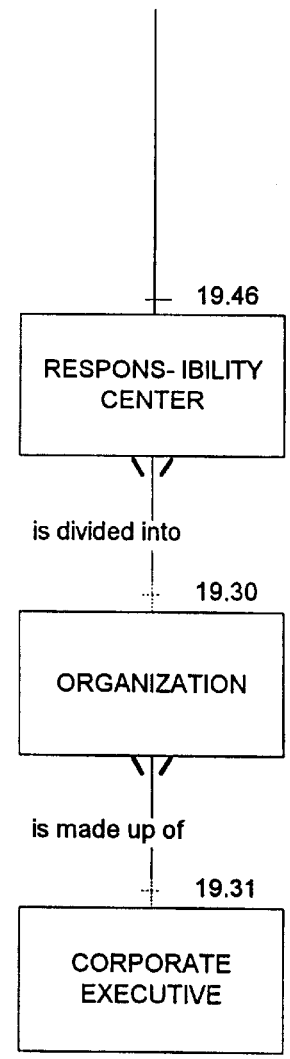

The application analysis flag illustrated in FIG. 18 presents the user with the option to include or exclude an application from reporting and analysis 18.1. If the user decides to include the application, the application data will be included in application, responsibility center, organization, and corporate executive reports 18.2. If the user excludes the application, the application is not included in reporting 18.3.

Figure 2:
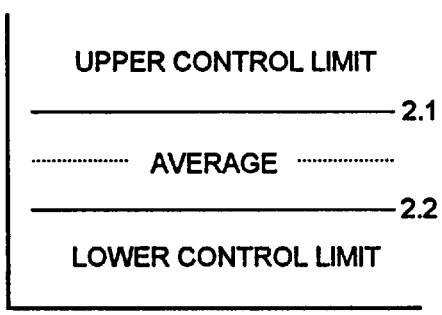
FIG. 2 is a metric chart in the form of a graph of upper and lower control limits.

Another unique reporting capability of the present invention is the calculating upper and lower control limits of FIG. 2. The following Organization Portfolio shown report in Table VIII lists the responsibility centers that comprise the organization, according to FIG. 3, the number of applications that comprise the responsibility center, the number of adjusted function points, the average number of function points per application which also may contain a "+" if the size is above the control limits or a "−" if the size is below the control limit, and the average application age. The average application size and average application age for the organization is then listed, followed by the upper and lower control limits for each.

TABLE VIII

Organization Portfolio Report

| Responsibility Center | Number of Applications | Adjusted Function Points | Average* Application Size | Average** Application Age |
|---|---|---|---|---|
| Organization: ORGANIZATION ONE | | | | |
| RESP CENTER ONE | 5 | 2500 | 500+ | 4 |
| RESP CENTER THREE | 3 | 900 | 300− | 7+ |
| Totals | 8 | 3400 | | |
| * Average Application Size | | | 425.00 | |
| Upper Control Limit | | | 475.00 | |
| Lower Control Limit | | | 375.00 | |
| ** Average Application Age | | | 5.1 | |
| Upper Control Limit | | | 6.0 | |
| Lower Control Limit | | | 4.0 | |

*Total Application FP/Number of Applications
**Total Application Age/Number of Applications
"+" at right of Age or Size indicates number above control limit
"−" at right of Age or Size indicates number below lower control limit The formulas for calculating the upper and lower control limits for all of the analysis reports according to the present invention follow:

$$UpperControlLimit = Ave. + 3 * \sqrt{Ave}.$$

$$LowerControlLimit = Ave. - 3 * \sqrt{Ave}.$$

As previously described, one of the unique features of the present invention is the integration of measurement, metric and attribute data at both the application and project levels. In particular, FIG. 7 and FIG. 8 show the integration of measurement, metric and attribute data at the application and project levels, respectively. FIG. 19, on the other hand, shows the integration method of application and measurement data for the present invention, in effect combining the application and project level presentations of FIGS. 7 and 8, respectively.

Application related data is represented at the upper half of FIG. 19 and project related data is represented at the lower half. The master application and project data stores are illustrated by blocks 19.1 and 19.2 respectively. The application measurement information includes size in transaction 19.3 and data 19.4 function point counts. Transaction components consist of external inputs, external outputs, and external inquiries. Data components consist of external interface files and external interface files. Also stored as application measurement information are costs 19.26 and defect incidents 19.10. Application metrics are calculated by application ratios 19.28. Application process attributes include teams 19.13, environment 19.12, and application attributes 19.53. An application snapshot is initiated by the user to create a point in time view-only record of the application, which is stored block 19.18.

Application data is reported to the responsibility center 19.46, which is reported to the organization level 19.30, which in turn is reported to the corporate executive level 19.31 of the organization. Project size information is tracked in the transaction data store 19.33 and in the data store 19.34. Transaction components include external inputs, external output, and external inquiry data. Data components include internal logical file and external interface file data. Other measures tracked for the project include time, 19.45, cost 19.27, and defects 19.44. Project attribute information includes project teams 19.43, project environment 19.42, project tools and techniques 19.41. A project snapshot may be taken by the user to create a point in time view-only record of the project, which is stored in block 19.40.

The present invention protects the integrity of its stored data with a user access security system 19.25. Users are classified as system administrators, application managers, project managers, and non-manager users. The system administrator may format the present invention and create and modify any stored application or project. An application manager may create and modify an application and all of the application's related projects, and may also view all stored application and project information. A project manager may create and modify a project and view all stored application and project information. A non-manager user may view all stored application and project data.

The system administrator defines the present invention's repository to reflect an organization's terminology. The system administrator defined repositories and a short description are included herein. Application attributes 19.52 are defined application criteria that are rated by application managers to characterize their applications. Environment 19.40 includes work environment factors that can be selected by application and project managers to characterize working conditions of applications and projects. Team criteria 19.61 are criteria used to rate team performance by application and project managers. Team definitions 19.62 are defined teams available to projects and applications. Tool validation values 19.65 provide project managers criteria to rate project tools. Tool sets available 19.10 are selected by project managers to reflect the utilities used to complete a project. Tool definitions 19.60 define tool sets. Tool types 19.51 classify tool sets into larger tool categories. Cost codes 19.59 are used by application and project managers to track application and project costs. Time codes 19.45 are used by project managers to record the time spent to complete a project. Process codes 19.21 specify the different task groupings of an organization. Project managers use process codes to organize the work assignments of a project. Project categories 19.55 are used by project managers to categorize projects for reporting purposes. Phase codes 19.32 are used by project managers to reflect the different time periods of a project's life cycle. Project types 19.20 are used by the project manager to specify if the project is baseline, development, repair, enhancement, conversion, user-defined, or preventive maintenance. The system administrator may also define project types that are used by an organization, but not included on this list. Project classes 19.56 are used by project managers to classify projects for reporting purposes. Project group codes 19.57 are used by project managers to group projects for reporting purposes.

Considering the present invention in its entirety, each module in the program according to the present invention is designed from a corresponding written specification used in generating the invention's operational code. To present all of these specifications would not be necessary to enable persons skilled in the art to make and use the invention. Furthermore, presenting all of these specifications would result in a detailed description unduly large and cumbersome. However, an example of the written specifications for the screen component module is included herein as an appendix as an illustration of a typical module. The screen component module records and calculate the external input, external output, and external inquiry function point counts by screens of an application. In addition to providing an example of the subject matter used in programming the present invention, the screen component specification contains the detailed instruction used in programming the component explosion feature of the invention. The information given in this example, when taken with the remainder of the detailed description, is considered to be more than adequate to enable persons skilled in the art to design the other modules of the program according to the present invention.

While an embodiment of the present invention has been described in detail, that has been done for purposes of illustration, not limitation.

What is claimed is:

1. A measurement analysis computer software method for supporting a direct relationship between information stored at the project level and information stored at the application level, wherein a project comprises a collection of work tasks with a time frame and a work product to be delivered and an application comprises a cohesive collection of automated procedures and data supporting an objective and one or more components, modules or sub-systems, said method comprising the steps of:

a) directly relating application function point component information to function point component information of a project related to an application, said component comprising a unique process or data requirement of the project or application; and b) directly relating functional characteristic information of an application to functional characteristic information of a project related to said application wherein steps (a) and (b) are initiated by user.

2. A method according to claim 1 further comprising the steps of:

a) directly relating time information of an application to time information of a project related to the application upon user's initiation;

b) directly relating project and application cost information upon user's initiation;

c) directly relating application and project team work environment information, wherein steps (a), (b) and (c) are initiated by user.

3. A measurement analysis computer software system for providing accurate movement of data between projects and applications to protect the integrity of project and application data, wherein a project comprises a collection of work tasks with a time frame and a work product to be delivered and an application comprises a cohesive collection and one or more components, modules or subsystem and wherein projects create and maintain applications, said system comprising means for selectively transferring information by user between an application and projects related to said application whereby information entered in a project data store modifies information entered in an application data store during said accurate movement of data.

4. A system according to claim 3, wherein said means for selectively transferring information by user moves function point information between projects and applications and includes means for providing baseline, development project update to an application wherein an application receives initial measurement and work environment information from a baseline or development project, said baseline or development project being the work effort which initiates an application.

5. A system according to claim 4, wherein said means for providing baseline, development project update to an application comprises:

a) means for presenting a list of project data for update to the application;

b) means for selecting desired project data to update the project to the application and for initiating an update process; and c) means for updating the application with the project data.

6. A system according to claim 3, wherein said means for selectively transferring information by user moves function point information between projects and applications and includes means for providing maintenance project update so that changes are made to an application through maintenance and enhancement projects and information from said projects is updated to the application.

7. A system according to claim 6, wherein said means for providing maintenance project update comprises:

a) means for optionally generating a preupdate log to indicate the presence of any conflicts in update data caused by update of a previous update;

b) means for listing project data which can be updated to the application;

c) means for updating the project to the application in response to a selection of project data; and d) means for providing information as to the existence and nature of conflicts caused by the update and for providing information as to possible resolutions of such conflicts.

8. A system according to claim 3, wherein said means for selectively transferring information by user moves function point information between projects and applications and includes means for providing application copy to a baseline or development project to copy the data of one application to another by providing accurate movement of said data from an existing application to a new baseline or development project.

9. A system according to claim 8, wherein said means for providing application copy to a baseline or development project comprises:

a) means for accepting the application or application ID code to be copied to the project;

b) means for providing a selection list of application data that can be copied to the application; and c) means for copying selected information from the application to the project.

10. A system according to claim 3, wherein said means for selectively transferring information by user moves function point information between projects and applications and includes means for providing application copy to a maintenance or enhancement project to create maintenance and enhancement projects by copying application details to be modified or deleted from the application to the project.

11. A system according to claim 10, wherein said means for providing application copy to a maintenance or enhancement project comprises:

a) means for providing a list of application information that can be copied from the application to the project; and b) means for copying selected information from the application to the project.

12. A system according to claim 3, wherein said means for selectively transferring information by user moves function point information between projects and applications and includes means to backout from the application the effects of a project update.

13. A system according to claim 12, wherein said means to backout comprises:

a) means for providing a list of applications and the projects which updated said applications;

b) means for selecting an application and project;

c) means for determining if the selected project is the most recent project to update the application;

d) means operatively associated with said determining means to indicate that update cannot take place if the selected project is not the most recent project to update the application; and e) means for withdrawing project data from the application.

14. A measurement analysis computer software method for providing accurate movement of data between projects and applications to protect the integrity of project and application data, wherein a project comprises a collection of work tasks with a time frame and a work product to be delivered and an application comprises a cohesive collection of automated procedures and data supporting an objective and one or more components, modules, or subsystems and wherein projects create and maintain applications, said method comprising the step of transferring information between an application and projects related to said application said transferring step initiated by user whereby information entered in a project data store modifies information entered in an application data store during said accurate movement of data.

15. A method according to claim 14, wherein said transferring information between an application and projects related to said application said transferring step initiated by user comprises moving function point information between projects and applications for providing baseline, development project update to an application wherein an application receives initial measurement and work environment information from a baseline or development project, said baseline or development project being the work effect which initiates an application.

16. A method according to claim 15, wherein said providing baseline, developement project update to an application comprises:

a) presenting a list of project data for update to the application;

b) selecting desired project data to update the project to the application;

c) initiating an update process; and d) updating the application with the project data.

17. A method according to claim 14, wherein said transferring information between an application and projects related to said application said transferring step initiated by user comprises moving function point information between projects and applications for providing maintenance project update for making changes to an application through maintenance and enhancement projects and updating information from said projects to said application.

18. A method according to claim 17, wherein said providing maintenance project update comprises:

a) optionally generating a pre-update log to indicate the presence of any conflicts in update data caused by update of a previous update;

b) providing a list of project data that can be updated to the application;

c) selecting the project data;

d) updating the project to the application;

e) providing information as to any conflicts caused by the update including describing such conflicts; and f) providing possible resolutions of such conflicts.

19. A method according to claim 14, wherein said transferring information between an application and projects related to said application said transferring step initiated by user comprises moving function point information between projects and applications for providing application copy to baseline or development project to copy the data of one application to another by providing accurate movement of said data from an existing application to a new baseline or development project.

20. A method according to claim 19, wherein said providing application copy to a baseline or development project comprises:

a) accepting the application ID code or the application to be copied to the project;

b) providing a selection list of application data that can be copied to the application; and c) copying selected information from the application to the project.

21. A method according to claim 14, wherein said transferring information between an application and projects related to said application said transferring step initiated by user comprises moving function point information between projects and applications for providing application copy to a maintenance or enhancement project to create maintenance and enhancement projects by copying application details to be modified or deleted from the application to the project.

22. A method according to claim 21, wherein said providing application copy to a maintenance or enhancement project comprises:

a) providing a list of application information that can be copied from the application to the project; and b) copying selected information from the application to the project.

23. A method according to claim 14, wherein said transferring information between an application and projects related to said application said transferring step initiated by user comprises moving function point information between projects and applications and includes backing out from the application the effects of a project update.

24. A method according to claim 23, wherein said backing out from the application the effects of a project update comprises:

a) providing a list of applications and the projects which updated said applications;

b) selecting an application and project;

c) determining if the selected project is the most recent project to update the application;

d) indicating that update cannot take place if the selected project is not the most recent project to update the application; and e) withdrawing project data from the application.

25. In a measurement analysis computer software system:

a) means for storing information at the project level wherein a project comprises a collection of work tasks with a time frame and a work product to be delivered;

b) means for storing information at the application level wherein an application comprises a cohesive collection of automated procedures and data supporting an objective and one or more components, modules or subsystems; and c) means to include and exclude selectively applications and projects from analysis and reporting so that adjustment applications or projects entered to mend previous data entry errors made during work on the other applications or projects can be excluded from analysis and reporting results of complete applications and projects which were recorded.

26. A system according to claim 25, wherein said means to include and exclude selectively applications and projects from analysis and reporting comprises:
   a) means for inputting an include designation for a predetermined field on an overview screen of either a project or an application; and
   b) means for inputting an exclude designation for a predetermined field on an overview screen of either a project or an application.

27. In a measurement analysis computer software system:
   a) storing information at the project level wherein a project comprises a collection of work tasks with a time frame and a work product to be delivered;
   b) storing information at the application level wherein an application comprises a cohesive collection of automated procedures and data supporting an objective and one or more components, modules or subsystems; and
   c) selectively including and excluding applications and projects from analysis and reporting so that adjustment applications or projects entered to mend previous data entry errors made during work on the other applications or projects can be excluded from analysis and reporting results of complete applications and projects which were recorded.

28. A method according to claim 27, wherein said selectively including and excluding applications and projects from analysis and reporting comprises:
   a) inputting an include designation for a predetermined field on an overview screen of either a project or an application; and
   b) inputting an exclude designation for a predetermined field on an overview screen of either a project or an application.

29. A measurement analysis computer software system comprising:
   a) means for storing information at the project level wherein a project comprises a collection of work tasks with a time frame and a work product to be delivered;
   b) means for storing information at the application level wherein an application comprises a cohesive collection of automated procedures and data supporting an objective and one or more components, modules or subsystems;
   c) means for supporting a direct relationship between information stored at the project level and information stored at the application level;
   d) means for integrating measurement, metric and attribute data including data repositories for measurement, metric and attribute data at said project and application levels;
   e) component explosion means enabling the data processor to enter multiple components with one entry;
   f) means for providing accurate movement of data between projects and applications to protect the integrity of project and application data; and
   g) means for selectively including and excluding applications and projects form analysis and reporting.

30. A measurement analysis computer software method comprising:
   a) storing information at the project level wherein a project comprises a collection of work tasks with a time frame and a work product to be delivered;
   b) storing information at the application level wherein an application comprises a cohesive collection of automated procedures and data supporting an objective and one or more components, modules or sub-systems;
   c) providing a direct relationship between information stored ath the project level and information stored at the application level;
   d) integrating measurement, metric and attribute data including data repositories for measurement, metric and attribute data at said project and application levels;
   e) performing a component explosion process to enable entering multiple components with one entry;
   f) providing accurate movement of data between projects and applications to protect the integrity of project and application data; and
   g) selectively including and excluding applications and projects from analysis and reporting.

* * * * *